(12) United States Patent
Ifuku et al.

(10) Patent No.: US 7,528,532 B2
(45) Date of Patent: May 5, 2009

(54) PIEZOELECTRIC SUBSTANCE AND MANUFACTURING METHOD THEREOF, PIEZOELECTRIC ELEMENT AND LIQUID DISCHARGE HEAD USING SUCH PIEZOELECTRIC ELEMENT AND LIQUID DISCHARGE APPARATUS

(75) Inventors: Toshihiro Ifuku, Yokohama (JP); Katsumi Aoki, Yokohama (JP); Takanori Matsuda, Chofu (JP); Hiroshi Funakubo, Yokohama (JP); Shintaro Yokoyama, Yokohama (JP); Satoshi Okamoto, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 434 days.

(21) Appl. No.: 11/464,993

(22) Filed: Aug. 16, 2006

(65) Prior Publication Data

US 2007/0046154 A1 Mar. 1, 2007

(30) Foreign Application Priority Data

Aug. 23, 2005 (JP) ............................. 2005-241430

(51) Int. Cl.
*H01L 41/08* (2006.01)
(52) U.S. Cl. ..................................... 310/360
(58) Field of Classification Search ................ 310/360, 310/358
See application file for complete search history.

(56) References Cited

U.S. PATENT DOCUMENTS

| | | | |
|---|---|---|---|
| 6,577,039 B2 * | 6/2003 | Ishida et al. ................ | 310/300 |
| 6,653,211 B2 | 11/2003 | Unno et al. | |
| 6,747,357 B2 * | 6/2004 | Lee et al. ..................... | 257/760 |
| 6,809,856 B2 * | 10/2004 | Reed et al. .................. | 359/326 |
| 6,854,832 B2 | 2/2005 | Matsuda | |
| 6,927,084 B2 | 8/2005 | Fukui et al. | |
| 7,045,935 B2 | 5/2006 | Matsuda et al. | |
| 7,053,526 B2 | 5/2006 | Unno et al. | |
| 7,059,711 B2 | 6/2006 | Aoto et al. | |
| 7,079,308 B2 * | 7/2006 | Reed et al. .................. | 359/326 |
| 7,120,978 B2 | 10/2006 | Wasa et al. | |
| 7,144,101 B2 | 12/2006 | Ifuku et al. | |

(Continued)

FOREIGN PATENT DOCUMENTS

JP 3397538 B2 2/2003

OTHER PUBLICATIONS

S.K. Singh, et al., "Crystalline Properties of Ferroelectric-Relaxor PMN-PT Thin Films by Pulsed Laser Deposition", "Applications of Ferroelectrics", 2002. ISAF 2002. Proceedings of the 13th IEEE International Symposium p. 133-136.

(Continued)

*Primary Examiner*—Mark Budd
(74) *Attorney, Agent, or Firm*—Fitzpatrick, Cella, Harper & Scinto

(57) ABSTRACT

The present invention provides a piezoelectric substance of single crystal or uniaxial crystal type in which three lattice lengths a, b and c of a unit lattice of the piezoelectric substance are smaller than lattice length $a_0$, $b_0$ and $c_0$ of a unit lattice of a bulk state of single crystal having the same temperature and same composition, respectively, and a volume of the unit lattice of the piezoelectric substance is smaller than a volume of the unit lattice of the bulk state of single crystal having the same temperature and same composition.

9 Claims, 14 Drawing Sheets

U.S. PATENT DOCUMENTS

| | | |
|---|---|---|
| 2004/0155559 A1 | 8/2004 | Ifuku et al. |
| 2005/0127780 A1 | 6/2005 | Ifuku et al. |
| 2005/0168112 A1 | 8/2005 | Aoki et al. |
| 2005/0189849 A1 | 9/2005 | Ifuku et al. |
| 2005/0219793 A1 | 10/2005 | Matsuda et al. |
| 2006/0033404 A1 | 2/2006 | Fukui et al. |
| 2006/0049135 A1 | 3/2006 | Okabe et al. |
| 2007/0046152 A1 | 3/2007 | Ifuku et al. |
| 2007/0046153 A1 | 3/2007 | Matsuda et al. |
| 2007/0046734 A1 | 3/2007 | Aoki et al. |
| 2007/0048190 A1 | 3/2007 | Ifuku et al. |
| 2007/0060467 A1 | 3/2007 | Matsuda et al. |

OTHER PUBLICATIONS

J.G. Smits, et al., "The Constituent Equations of Piezoelectric Heterogeneous Bimporh", IEEE trans. Ultrasonics Ferroelectrics and Frequency Control, May 1991, vol. 38, p. 256-270.

* cited by examiner

PIEZOELECTRIC SUBSTANCE AND MANUFACTURING METHOD THEREOF, PIEZOELECTRIC ELEMENT AND LIQUID DISCHARGE HEAD USING SUCH PIEZOELECTRIC ELEMENT AND LIQUID DISCHARGE APPARATUS

BACKGROUND OF THE INVENTION

1. Field of the Invention

The present invention relates to a piezoelectric substance and a manufacturing method thereof, a piezoelectric substance and a liquid discharge head using such a piezoelectric element, and a liquid discharge apparatus.

2. Description of the Related Art

In recent years, piezoelectric actuators have been watched as new motors in place of electromagnetic motors in a portable information equipment field and chemical and medical field, in the point that motors can be miniaturized and be arranged with high density. During the operation, the piezoelectric actuator does not generate electromagnetic noise and is not influenced by noise. Further, the piezoelectric actuator has been watched as a technique for manufacturing equipment of sub-millimeter class as represented by a micro machine, and a minute piezoelectric element has been requested as a drive source of the equipment.

In general, the piezoelectric element is generally manufactured by forming a sintered piece or a single crystal piece of a bulk material obtained by applying heat treatment to the piezoelectric substance into a minute shape having desired dimension and thickness, by means of a technique such as cutting, polishing and the like. Further, when the minute piezoelectric element is formed, generally, the piezoelectric element is directly formed by coating a green sheet-shaped piezoelectric substance at a predetermined position on a metal or silicon substrate and burning the piezoelectric substance, by using a printing method or the like. The article formed from such a green sheet has a thickness of about several tens of μm to several hundreds of μm and electrodes are disposed above and below the piezoelectric substance and voltage is applied via the electrodes.

In the past, the minute piezoelectric element as used in a liquid discharge head was minutely-formed from the piezoelectric substance of bulk material by using the above-mentioned technique such as cutting, polishing or the like or was manufactured by using the green sheet-shaped piezoelectric substance. An example of an apparatus using such a piezoelectric element includes, for example, a liquid discharge head having a piezoelectric element structure of unimorph type. The liquid discharge head comprises pressure chambers in communication with ink supply chambers and ink discharge ports in communication with the respective pressure chambers and constructed so that a vibrating plate to which the piezoelectric element is joined or on which the piezoelectric element is directly formed is situated within each pressure chamber. With this arrangement, by applying predetermined voltage to the piezoelectric element to cause expansion and contraction of the piezoelectric element, flexion vibration is generated to compress ink in the pressure chamber, thereby discharging an ink droplet from the ink discharge port.

Nowadays, although color ink jet printers utilizing the above-mentioned action have been popularized, enhancement of printing performance thereof, particularly higher resolving power and higher speed printing have been requested. To this end, it has been tried to achieve the high resolving power and the high speed printing by using a multi-nozzle head structure in which the liquid discharge heads are miniaturized. In order to miniaturize the liquid discharge head, it is necessary to further miniaturize the piezoelectric element for causing the discharging of the ink. Further, in recent years, the liquid discharge head has actively been tried to be applied to an industrial application, such as wiring direct drawing. In this case, it is necessary to achieve patterning of liquid having more diverse properties with a higher resolving power, and, thus, higher performance of the liquid discharge head has been requested.

In recent years, due to development of micro machine techniques, investigations for developing a super-small-sized high accurate piezoelectric element by forming the piezoelectric substance as a thin film and by using freely minute-working techniques used in a semiconductor field have been made. A thickness of the piezoelectric substance formed, particularly, by a thin film method such as a sputtering method, a chemical vapor synthesizing method, a sol-gel method, a gas deposition method, a pulse laser deposition method and the like is generally about several hundreds of nm to several tens of μm, in the application to the piezoelectric actuator. Further, electrodes are provided in association with the piezoelectric substance so that voltage is applied via the electrodes.

On the other hand, due to the miniaturization of the piezoelectric element, piezoelectric substance materials having higher performance representing a higher piezoelectric property have actively been investigated. As a material for the piezoelectric substance which has recently been watched, materials of relaxor group have been examined, and, for example, in Japanese Patent No. 3397538, a method for synthesizing lead magnesiumate niobate titanate (also referred to as PMN-PT) by flux fusing or melting is described. It has been reported that a bulk-like single crystal member can be obtained by such a synthesizing method and a material having a great strain amount exceeding 1% is obtained.

Further, it has been examined that the piezoelectric substance is formed from the material of relaxor group by using the thin film method such as the sputtering method, chemical vapor synthesizing method, sol-gel method, gas deposition method, pulse laser deposition method and the like. For example, in the document "Applications of Ferroelectrics" (2002. ISAF 2002. Proceedings of the 13th IEEE International Symposium p. 133-136), it is reported that a PMN-PT thin film was film-formed by the pulse laser deposition method (also referred to as PLD method).

However, for example, since an MEMS piezoelectric actuator which has recently been developed actively has a minute structure, if a single crystal material grown into a bulk shape as described in the above Japanese Patent No. 3397538 is used, it is necessary that the single crystal is sliced (by cutting, polishing or the like) to join the crystals together. It is difficult to apply the bulk-like single crystal material to a high accurate minute piezoelectric element. Further, also in the single crystal piezoelectric substance thin film of relaxor group formed by the thin film method, a high piezoelectric property which can be expected from the bulk-like single crystal member could not be realized and the difference therebetween is very great. Thus, in order to enhance the piezoelectric property of the single crystal piezoelectric substance thin film of relaxor group obtained by the thin film method, a further improvement in the thin film is required.

SUMMARY OF THE INVENTION

An object of the present invention is to solve the above problems and to provide a piezoelectric substance having a high piezoelectric property and a method for manufacturing such a piezoelectric substance, and a piezoelectric element. Further, an object of the present invention is to provide a liquid discharge head representing a uniform and high discharge performance and capable of being subjected to minute patterning and a liquid discharge apparatus having such a liquid discharge head.

The above object is achieved by a piezoelectric substance of single crystal or uniaxial crystal type in which three lattice lengths a, b and c of a unit lattice of the piezoelectric substance are smaller than lattice lengths $a_0$, $b_0$ and $c_0$ of a unit lattice of a bulk-like single crystal member having the same temperature and same composition, respectively, and a volume of the unit lattice of the piezoelectric substance is smaller than a volume of the unit lattice of the bulk-like single crystal member having the same temperature and same composition.

Further, the above object is achieved by a piezoelectric element comprising a piezoelectric substance of the present invention and a pair of electrodes contacted with the piezoelectric substance.

Further, the above object is achieved by a liquid discharge head comprising separate liquid chambers in communication with discharge ports and piezoelectric substance elements provided in association with the separate liquid chambers and adapted to discharge liquid from the separate liquid chambers via the discharge ports and wherein the piezoelectric element is a piezoelectric element of the present invention.

Further, the above object is achieved by a method for manufacturing a piezoelectric substance of the present invention, comprising the steps of heating a substrate situated out of an area onto which a target area is projected in a direction perpendicular to a sputtering face of a target to a temperature higher than 400° C. and lower than 800° C. and forming the piezoelectric substance on a surface of the substrate by a magnetron sputtering method.

Further, the above object is achieved by a liquid discharge apparatus having a liquid discharge head of the present invention.

According to the present invention, a piezoelectric substance and a piezoelectric element having a high piezoelectric property can be obtained. Further, by using the piezoelectric element of the present invention, a liquid discharge head, presenting a uniform and high discharge performance and capable of being subjected to minute patterning, and a liquid discharge apparatus having such a liquid discharge head can be obtained.

In general, in the bulk-like single crystal member such as lead magnesiumate niobate titanate, after the material is heated to a thousand and several hundreds of ° C. by a flux melting method to liquidize the material, when the material is cooled, the single crystal member is formed by a thermodynamically equilibrated solid/liquid reaction. For this reason, it is considered that a lattice defect, caused by oxygen deficiency and lead deficiency in the crystal and site defects of respective constituting elements constituting crystal lattices, is much less. On the other hand, in the thin film method, a single crystal thin film is formed at a low temperature of about 600° C. by using a method, other than the solid/liquid reaction, such as energy assist by means of plasma or laser, injection of solid particles or chemical reaction of raw material molecules. For this reason, it is considered that a defect caused by oxygen deficiency and lead deficiency in the crystal and site defects of the respective constituting elements constituting crystal lattices is very great.

One of the reasons why it was not reported that the single crystal piezoelectric substance element thin film of relaxor group provides the high piezoelectric property expected from the bulk-like single crystal member is considered to be a difference between a method for manufacturing the bulk-like single crystal member and a method for manufacturing the single crystal thin film. However, as a result of Inventor's zealous investigations, it was found that, even in the thin film, the high piezoelectric property can be realized so long as the following conditions are satisfied. That is to say, the piezoelectric substance is single crystal or uniaxial crystal and three lattice lengths a, b and c of a unit lattice of the piezoelectric substance are smaller than lattice lengths $a_0$, $b_0$ and $c_0$ of a unit lattice of a bulk-like single crystal member having the same temperature and same composition as those of the piezoelectric substance. Further, a volume of the unit lattice of the piezoelectric substance may be smaller than a volume of the bulk-like single crystal member having the same temperature and same composition as those of the piezoelectric substance.

Although the details of a mechanism in which the volume of the unit lattice of the single crystal piezoelectric substance thin film of relaxor group becomes smaller than the volume of the bulk-like single crystal member is not clear, it is considered that the mechanism, for example, is based on a relationship between a film forming temperature and a Curie temperature of the film and a coefficient of thermal expansion of the substrate. However, in conventional single crystal piezoelectric substance thin films, it may be influenced by the defects caused by the oxygen deficiency and lead deficiency in the crystal and the site defects of the respective constituting elements constituting crystal lattices. Due to such influence, it is considered that it was possible to form the single crystal piezoelectric substance thin film having the volume of the unit lattice smaller than the bulk-like single crystal member.

Further features of the present invention will become apparent from the following description of exemplary embodiments with reference to the attached drawings.

BRIEF DESCRIPTION OF THE DRAWINGS

FIG. 15-1 is a schematic view showing a method for evaluating a piezoelectric property according to an embodiment of the present invention.

FIG. 15-2 is a schematic view showing a construction of a piezoelectric element according to an embodiment of the present invention.

FIG. 15-3 is a schematic view of a cantilever of unimorph type manufactured to evaluate the piezoelectric property of the piezoelectric element according to the embodiment.

DESCRIPTION OF THE EMBODIMENTS

The present invention will now be explained with reference to embodiments shown in the accompanying drawings.

Figure 6:
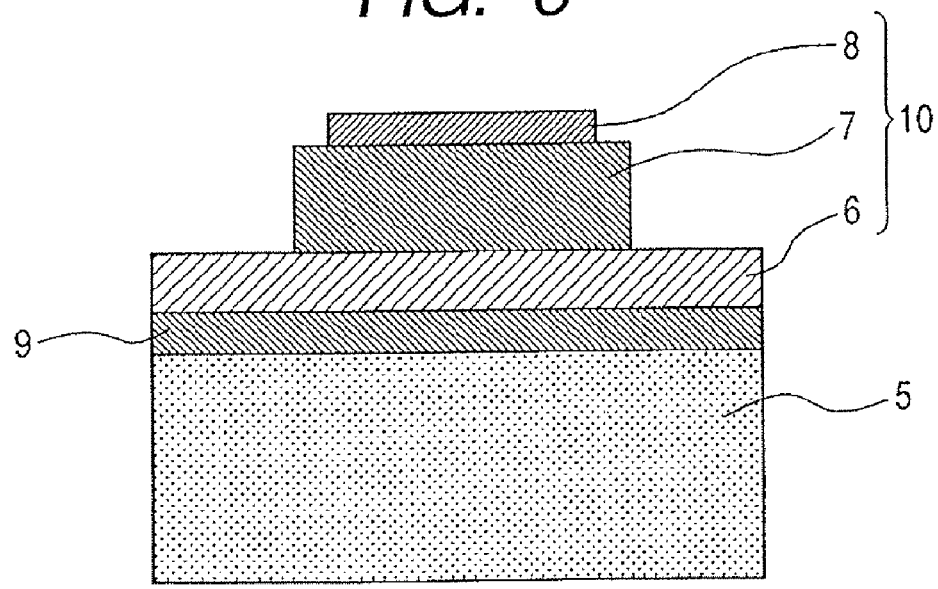
FIG. 6 is a schematic view showing an example of a piezoelectric element according to an embodiment of the present invention.

FIG. 6 is a schematic sectional view of a piezoelectric element according to an embodiment of the present invention. A piezoelectric element 10 according to the illustrated embodiment is a piezoelectric element (piezoelectric substance thin film element) including a first electrode film 6, a piezoelectric film 7 as a piezoelectric substance, and a second electrode film 8. In the piezoelectric element according to the embodiment shown in FIG. 6, although a cross-sectional shape of the piezoelectric element 10 is shown as a rectangular shape, such a shape may be a trapezoid or an inverted trapezoid. Although the piezoelectric element 10 according to the illustrated embodiment is formed on a substrate 5, the first electrode film 6 and the second electrode film 8 as a pair of electrode films constituting the piezoelectric element 10 according to the illustrated embodiment may be a lower electrode or an upper electrode, respectively. The reason is that the lower and upper electrodes are defined by a manufacturing method for a device and, in any case, they can achieve the effects of the present invention. Further, a buffer layer 9 may be provided between the substrate 5 and the lower electrode film 6.

The piezoelectric element 10 according to the illustrated embodiment can be manufactured by forming the first electrode film 6 at least on the substrate 5 or the buffer layer 9 formed on the substrate 5 and then forming a piezoelectric substance 7 thereon and further forming the second electrode film 8.

The piezoelectric substance 7 according to this embodiment has single crystal or uniaxial crystal. Three lattice lengths a, b and c of a unit lattice of the piezoelectric substance are smaller than lattice lengths $a_0$, $b_0$ and $c_0$ of a unit lattice of a bulk-like single crystal member having the same temperature and same composition as those of the piezoelectric substance. Further, a volume of the unit lattice of the piezoelectric substance 7 is smaller than a volume of the unit lattice of the bulk-like single crystal member having the same temperature and same composition. Here, "same composition" means that the compositions of both members coincide with each other with accuracy of about 0.1% and do not include impurities exceeding 1%.

Further, the piezoelectric substance 7 according to the illustrated embodiment is constituted by single crystal or uniaxial crystal of lead magnesiumate niobate titanate having a perovskite structure. Further, when it is assumed that element ratios of Mg (magnesium), Nb (niobium) and Ti (titanium) constituting the lead magnesiumate niobate titanate are X, Y and Z, respectively, conditions of X+Y+Z=1 and 0.2<Z<0.8 may be satisfied and a volume of the unit lattice of the lead magnesiumate niobate titanate at a temperature of 300K may be greater than 63.5 ($Å^3$). In addition, it is preferable that the volume of the unit lattice of the lead magnesiumate niobate titanate at the temperature of 300K is smaller than a value $V_1$ ($Å^3$) sought from the following equation (1) under a condition of 0.2<Z<0.33 and is smaller than a value $V_2$ ($Å^3$) sought from the following equation (2) under a condition of 0.33≦Z<0.8.

$$V_1 = -5.39 \times Z + 66.3 \quad (1)$$

$$V_2 = -1.85 \times Z + 65.1 \quad (2)$$

Figure 1:
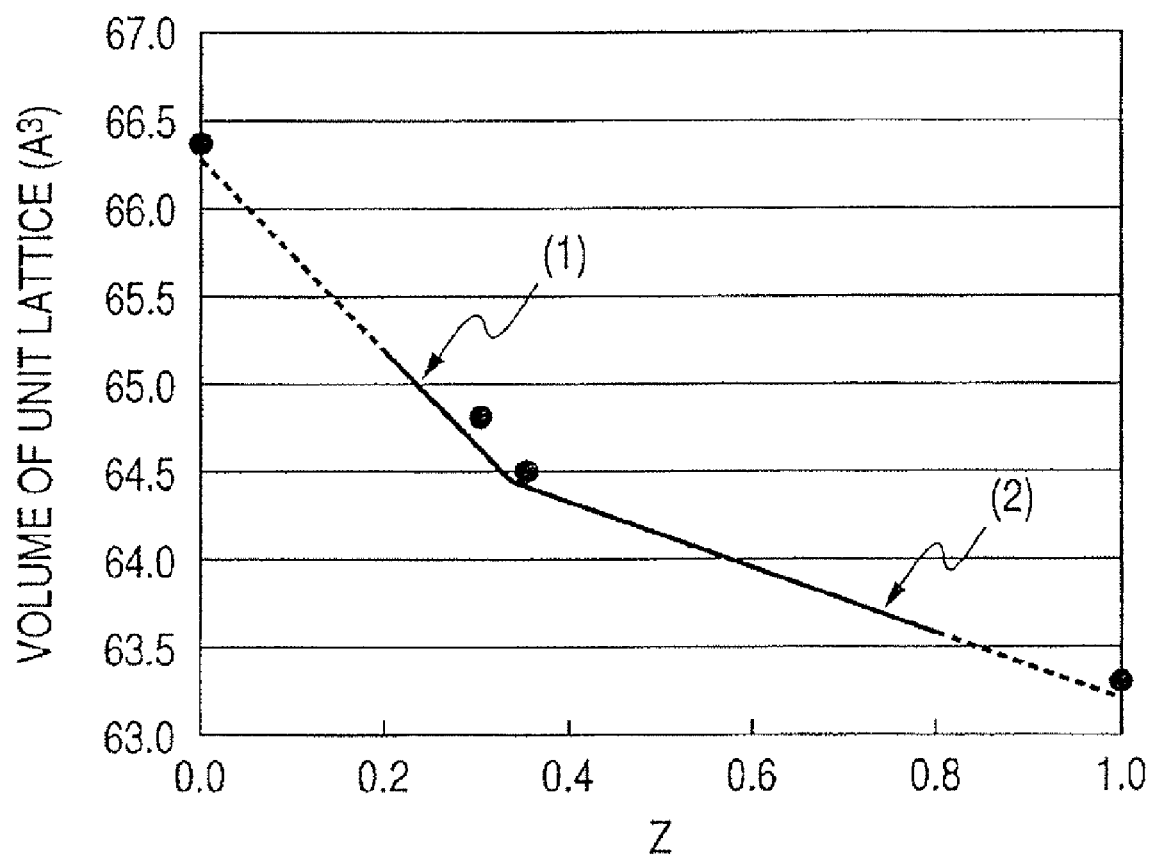
FIG. 1 is a graph showing a relationship between a change in an element ratio Z of titanium of a bulk-like single crystal member of lead magnesiumate niobate titanate and a change in a volume of a unit lattice, at a temperature of 300K.

It is assumed that element ratios of Mg, Nb and Ti constituting the lead magnesiumate niobate titanate are X, Y and Z, respectively. In FIG. 1, a relationship between the volume of the unit lattice of the bulk-like single crystal member of the lead magnesiumate niobate titanate formed by a Bridgeman method and Z in the above condition of X+Y+Z is shown by points. A straight line (1) in FIG. 1 shows the above equation (1) and a straight line (2) shows the above equation (2).

Here, in the piezoelectric substance according to the illustrated embodiment, if the volume of the unit lattice under the condition of 0.2<Z<0.33 is smaller than the value $V_1$ ($Å^3$) sought from the above equation (1), a high piezoelectric property can be realized. Further, similarly, if the volume of the unit lattice of the piezoelectric substance under the condition of 0.33≦Z<0.8 is smaller than the value $V_2$ ($Å^3$) sought from the above equation (2), the high piezoelectric property can be realized.

In this way, before and after the value of Z is 0.33, relationships between the volume of bulk and Z are differentiated. The reason is considered that MBP of the bulk body exists in the vicinity of Z of 0.33 and crystal phases are changed around the vicinity of 0.33. As Z is decreased from 0.33, a rate of rhombic crystals is increased, and, as Z is increased from 0.33, a rate of cubic crystals is increased.

When Z exists within a range of 0.2<Z<0.8, lead magnesiumate niobate titanate of single crystal or uniaxial crystal having only a perovskite structure can be formed relatively easily. Further, in general, the nearer Z is to 0.33, the higher the piezoelectric property that can be realized.

Further, if the volume of the unit lattice becomes too small, since it is difficult to include the perovskite structure, the volume of the unit lattice must be greater than 63.5 ($Å^3$).

Further, the piezoelectric substance 7 according to the illustrated embodiment includes single crystal or uniaxial crystal of lead magnesiumate noibate titanate having the perovskite structure. Further, when it is assumed that the element ratios of Mg, Nb and Ti constituting the lead magnesiumate niobate titanate are X, Y and Z, respectively, it is preferable that the element ratios X, Y and Z satisfy the conditions of X+Y+Z=1 and 0.33≦Z<0.5. The reason is that the high piezoelectric property can be realized in the range of 0.33≦Z<0.5.

Further, the electrodes (electrode films) according to this embodiment preferably have a film thickness greater than 1 μm and smaller than 10 μm. When the film thickness of the electrode film is selected to be greater than 1 μm, the piezoelectric element can have great displacement. Further, when the thickness is selected to be smaller than 10 μm, the piezoelectric element can be miniaturized.

The volume of the unit lattice of the piezoelectric substance according to the illustrated embodiment can be ascertained by using X-ray diffraction. For example, when the piezoelectric substance having <100> orientation of lead magnesiumate niobate titanate has a square crystal, relationships of a=b and α=β=γ=90° are established. Thus, by measuring (004) and (204) of the lead magnesiumate niobate titanate by using inverted lattice space mapping, the lattice lengths a and c of the unit lattice and an interior angle β can be sought and the volume of the unit lattice can be calculated. Similarly, when the piezoelectric substance having <111> orientation of lead magnesiumate niobate titanate has a rhombic crystal, relationships of a=b=c and α=β=γ are established. Thus, by measuring (222) and (224) and (114) of the lead magnesiumate niobate titanate by using the inverted lattice space mapping, the lattice lengths a and c of the unit lattice and the interior angle β can be sought and the volume of the unit lattice can be calculated.

Further, the crystal phase of the piezoelectric substance according to the illustrated embodiment can also be ascertained by using the X-ray diffraction. For example, when the piezoelectric substance having <100> orientation of lead magnesiumate niobate titanate has the square crystal, inverted lattice points of (004) and (204) are measured by using the inverted lattice space mapping. As a result, a relationship between a magnitude Qy(004) of the inverted lattice point of (004) in a y-axis direction and a magnitude Qy(204) of the inverted lattice point of (204) in the y-axis direction becomes Qy(004)=Qy(204). Further, for example, when the piezoelectric substance having <100> orientation of lead magnesiumate niobate titanate has the rhombic crystal, (004) and (204) are measured by using the inverted lattice space mapping. As a result, a relationship between a magnitude Qy(004) of the inverted lattice point of (004) in a y-axis direction and a magnitude Qy(204) of the inverted lattice point of (204) in the y-axis direction becomes Qy(004)>Qy(204) or Qy(004)<Qy(204). Thus, an inverted lattice point where a relationship between the magnitude Qy(004) of the inverted lattice point of (004) and a magnitude Qx(204) of (204) in an x-axis direction becomes Qy(004)≈2Qx(204) can be obtained. In this case, two inverted lattice points of (204) where conditions of Qy(004)>Qy(204) and Qy(004)<Qy(204) are both satisfied may exist. It is considered that these two inverted lattices are associated as twins. Here, a y-axis of the inverted lattice space is a thickness-wise direction of the piezoelectric substance and an x-axis is one direction of in-film directions of the piezoelectric substance.

Figure 2:
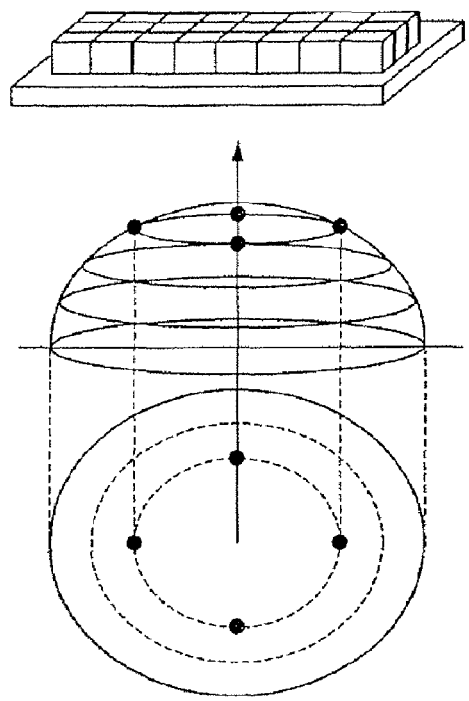
FIG. 2 is a schematic view showing an example of single crystal according to an embodiment of the present invention and showing positive pole points obtained by X-ray diffraction.

Further, in the illustrated embodiment, "single crystal" means any crystal having a single crystal orientation in the thickness-wise direction and the in-film direction. For example, a piezoelectric substance comprising <100> single crystal means a piezoelectric substance constituted by a single crystal or a plurality of crystals in which the thickness-wise direction is <100> orientation alone and one of the in-film directions is <110> orientation alone. By using the X-ray diffraction, it can be ascertained whether the piezoelectric substance has the uniaxial crystal or not. For example, in case of a piezoelectric substance comprising <100> single crystal of lead magnesiumate niobate titanate as perovskite oxide material of perovskite structure, the following result can be obtained. Regarding peaks caused by the piezoelectric substance in 2θ/θ measurement of the X-ray diffraction, only peaks in {L00} face (L=1, 2, 3, . . . , n: n is integral number) such as {100}, {200} and the like are detected. Further, when polar points in {110} asymmetrical face are measured, the following result can be obtained. That is to say, four polar points of {110} asymmetrical face of each crystal are measured as a symmetrical spot pattern at positions separated equidistantly at 90° on a circumference where the inclination from the thickness-wise direction of the piezoelectric substance shown by the arrow in FIG. 2 (direction normal to {L00} face of the crystal of the piezoelectric substance) becomes 45°.

Figure 3:
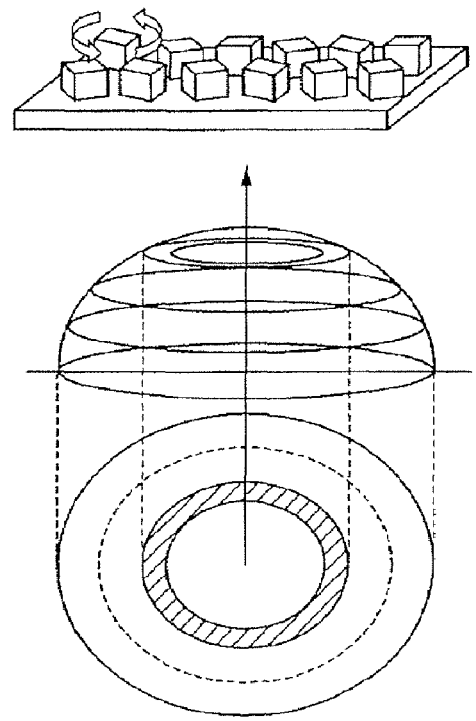
FIG. 3 is a schematic view showing an example of I-axial orientation crystal according to an embodiment of the present invention and showing positive pole points obtained by X-ray diffraction.

Further, the uniaxial crystal means a crystal having single crystal orientation in the thickness-wise direction of the piezoelectric substance; in this case, in-film orientation of the crystal may be any orientation. For example, <100> uniaxial crystals form a film constituted by crystals having the thickness-wise direction corresponding to <100> orientation alone. By using the X-ray diffraction, it can be ascertained whether the piezoelectric substance includes the uniaxial crystals or not. For example, in case of a piezoelectric substance comprising <100> uniaxial crystal of lead magnesiumate niobate titanate as perovskite oxide material of perovskite structure, the following result can be obtained. Regarding peaks caused by the piezoelectric substance in the 2θ/θ measurement of the X-ray diffraction, only peaks in {L00} face (L=1, 2, 3 . . . , n: n is integral number) such as {100}, {200} and the like are detected. Further, when polar points in {110} asymmetrical face are measured, the following result can be obtained. That is to say, polar points of {110} asymmetrical face of each crystal are measured as a ring-shaped pattern at positions separated equidistantly at 90° on a circumference where inclination from the thickness-wise direction of the piezoelectric substance shown by the arrow in FIG. 3 (direction normal to {L00} face of the crystal of the piezoelectric substance) becomes 45°.

Further, in this embodiment, the single crystal or the uniaxial crystal may include the following crystals. For example, in one of such a crystal, the polar points of {110} asymmetrical face of the lead magnesiumate niobate titanate, as <100> orientation perovskite oxide material, are measured. In this case, the polar points of {110} asymmetrical face of each crystal are measured as an eight-point symmetrical pattern or a twelve-point symmetrical pattern at positions separated equidistantly at 45° or 30° on a circumference where inclination from the thickness-wise direction of the piezoelectric substance shown by the arrow in FIG. 3 (direction normal to {L00} face of the crystal of the piezoelectric substance) becomes 45°. Further, regarding even a crystal in which an elliptical pattern is obtained in place of the spot pattern, since such a crystal has an intermediate symmetrical property between the single crystal and the uniaxial crystal, such a crystal is regarded as the single crystal or the uniaxial crystal in a broad sense. Similarly, in the illustrated embodiment, for example, a material in which plural crystal phases such as square crystal and rhombic crystal are mixed (mixed phase) and a material with which crystals caused by twin are mixed and a material including dislocation and/or defects are also regarded as the single crystal or the uniaxial crystal in a broad sense.

Here, in the illustrated embodiment, {100} generically expresses or represents six (in total) faces generally represented by (100), (010), (001) and the like, and, similarly, in the illustrated embodiment, <100> generically expresses six (in total) orientations generally represented by [100], [010], [001] and the like.

In general, for example, [100] and [001] are the same when the crystal system is the cubic crystal, but must be distinguished from each other when the crystal system is the square crystal or the rhombic crystal. However, even when the crystal of the lead magnesiumate niobate titanate as the perovskite oxide material is square crystal or the rhombic crystal, such crystal has lattice constant similar to that of the cubic crystal. Accordingly, in the illustrated embodiment, [100] and [001] of the square crystal and [111] and [−1−1−1] of the rhombic crystal are also generically referred to as <100> and/or <111>. Further, in the illustrated embodiment, <100> orientation means that the piezoelectric substance has <100> single crystal orientation in the thickness-wise direction, but, even when it is inclined by about several degrees, for example, when <100> crystal axis is inclined from the thickness-wise direction by about 5°, such orientation is referred to as <100> orientation.

As mentioned above, although the volume of the unit lattice of the piezoelectric substance and crystal phase and crystal orientation thereof can easily be ascertained by the X-ray diffraction, they can also be ascertained by, for example, section observation by using an electronic microscope of permeable type, other than the X-ray diffraction. In this case, for example, a case where column-shaped crystal dislocation exists in the thickness-wise direction and a case where twin can be ascertained are also regarded as single crystal in a broad sense.

Although a method for forming the piezoelectric substance according to the illustrated embodiment is not particularly limited, in the case of a thin film having a thickness smaller than 10 μm, normally, a thin film forming method such as a sol-gel method, a hydrothermal synthesizing method, a gas deposition method or an electrophoresis method can be used. Further, a thin film forming method such as a sputtering method, a chemical vapor deposition method (CVD method), an organic metal vapor deposition method (MOCVD method), an ion beam deposition method, a molecular beam epitaxy method, a laser ablation method and the like can also be used. In such a thin film forming method, since it is possible to attain the uniaxial orientation and/or single crystal of the piezoelectric substance by using epitaxial growth from the substrate or the lower electrode, a piezoelectric element having a higher piezoelectric property can easily be formed.

Figure 4:
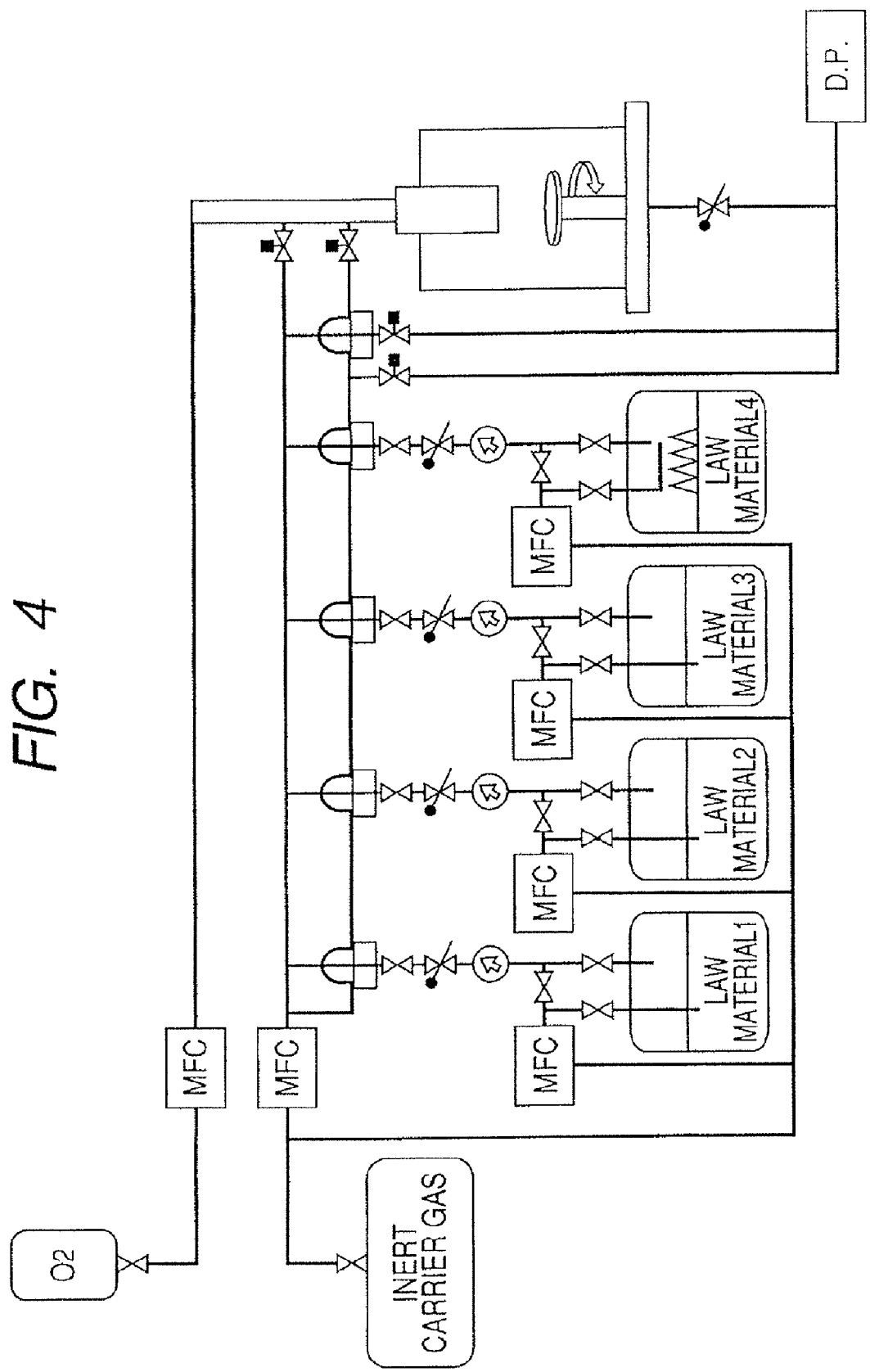
FIG. 4 is a schematic view showing an example of a pulse MOCVD method according to an embodiment of the present invention.

Further, the piezoelectric substance 7 according to the illustrated embodiment can be film-formed by a film forming method, particularly a pulse MOCVD method as shown in FIG. 4. In this way, a piezoelectric element in which the volume of the unit lattice of the piezoelectric substance is smaller than the volume of the bulk-like single crystal member having the same temperature and same composition as those of the piezoelectric substance and which has a great piezoelectric property can be formed.

In the pulse MOCVD method, in order to introduce starting raw material mixing gas into a reaction chamber uniformly, it is preferable that respective mixing gases be mixed with each other before the introduction. Further, it is preferable that temperature control of starting raw material supplying paths is carried out not to prevent an oxidizing reaction obstructing the formation of the single crystal film in piping. Further, in the pulse MOCVD method, it is preferable that inert carrier gas and the starting raw material mixing gas are supplied intermittently. In this case, by controlling the intermittent time for the mixing gas, adequate reaction time of the mixing gas on the substrate can be obtained, thereby suppressing damage of the film and the like. As a result, defects which would be caused by oxygen deficiency and lead deficiency in the piezoelectric substance and lattice site defects of the respective constituting elements constituting the crystal lattice can be suppressed, thereby providing easily forming a piezoelectric element in which a volume of a unit lattice thereof is smaller than that of a bulk-like single crystal and which has a high piezoelectric property.

Figure 5:
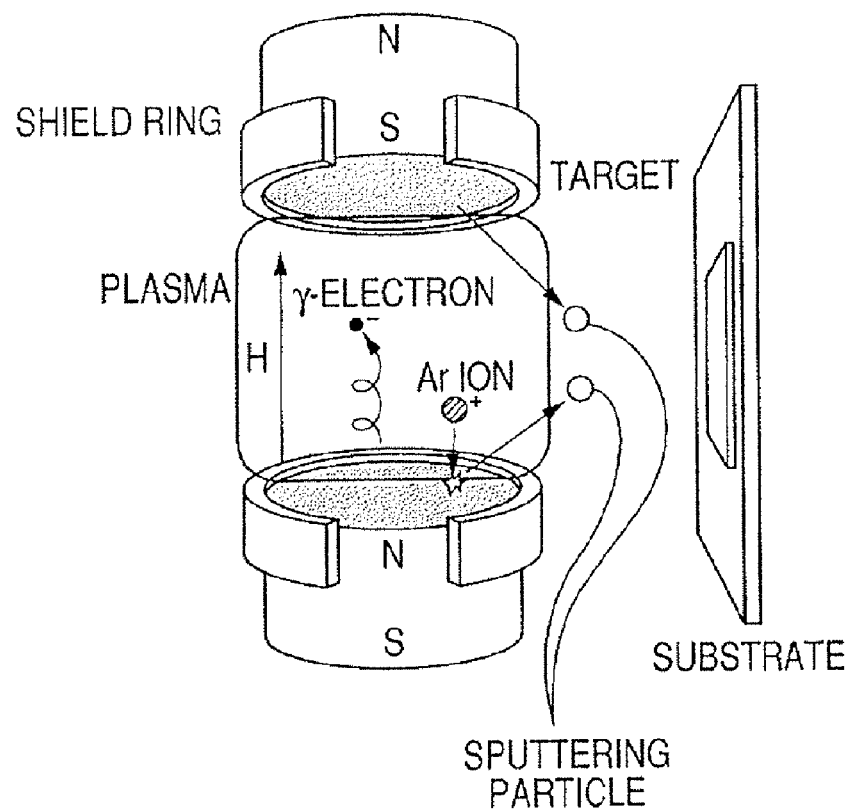
FIG. 5 is a schematic view showing an example of a magnetron sputtering method according to an embodiment of the present invention.

Further, the piezoelectric substance 7 according to the illustrated embodiment can be manufactured by a method particularly as shown in FIG. 5. In this case, a substrate having a surface heated to a temperature greater than 400° C. and smaller than 800° C. is installed out of a space onto which a target area of a target perpendicular to a sputtering surface is projected. A piezoelectric film is formed on the substrate by a magnetron sputtering method. In order to form lead magnesiumate niobate titanate of single crystal or uniaxial crystal having only a crystal of perovskite structure by the magnetron sputtering method, a temperature greater than 400° C. and smaller than 800° C. is required. Below 400° C., since due to insufficient energy on the substrate surface during the film formation, it is difficult to obtain the single crystal or the uniaxial crystal having only crystals of perovskite structure. On the other hand, above 800° C., since the lead becomes insufficient, it is difficult to obtain the single crystal or the uniaxial crystal having only crystals of perovskite structure. Generally, in order to form the lead magnesiumate niobate titanate by means of the magnetron sputtering method, there is a tendency that a higher film forming temperature than the normal magnetron sputtering method is required.

Further, in the above-mentioned arrangement, more preferably, the magnetron sputtering method includes a pair of targets spaced apart from and opposed to each other in parallel with each other, and magnetic field generating means disposed on rear surfaces of the targets and having different polarities. Due to a magnetic field generated by the magnetic field generating means, electrons (negative charges) in the plasma are strongly concentrated into an area onto which target areas of the opposed targets perpendicular to a sputtering surface are projected. Thus, plasma density greater than that of the normal magnetron sputtering method can be realized on that area. Further, the substrate is preferably located in a confronting relationship to a space defined between the pair of targets. Namely, the substrate is preferably positioned so that a direction perpendicular to the target surfaces intersects a direction perpendicular to the substrate.

By the above-mentioned method, a piezoelectric element in which a volume of a unit lattice of a piezoelectric substance is smaller than that of a bulk-like single crystal member having the same temperature and same composition as the piezoelectric substance and in which a high piezoelectric property can be formed.

Among film forming methods, particularly in the sputtering method, a damage of the film caused by plasma and/or γ-electrons is great and a damage of the damage caused by the fact that negative ions generated by the sputtering gas is accelerated toward the substrate by a magnetron magnetic field is also great. Thus, it is considered that there are many defects caused by the oxygen deficiency and lead deficiency in the crystal, and lattice site defects of the respective constituting elements constituting the crystal lattice. However, it is considered that when the above-mentioned sputtering method is applied, the defects can be suppressed. For example, as shown in FIG. 5, by locating the surface of the substrate perpendicular to the target surfaces and by positioning the substrate out of the area on which the opposed target surfaces are projected, the damage of the film caused by the plasma and/or γ-electrons and/or the sputtering gas can be suppressed. Thus, the defects caused by the oxygen deficiency and lead deficiency in the piezoelectric substance and the lattice site defects of the respective constituting elements constituting the crystal lattice can be suppressed, thereby easily forming a piezoelectric element in which a volume of a unit lattice thereof is smaller than that of a bulk-like single crystal member and which has a high piezoelectric property.

The first or the second electrode of the piezoelectric element according to the illustrated embodiment has a good closely-contacting ability with the piezoelectric substance and is preferably formed from a high conductive material i.e. a material capable of providing specific resistance of $10^{-7}$-$10^{-2}$ Ω·cm to the upper or lower electrode film. Such a material is generally metal; for example, Au, Ag or Cu or a metal of Pt group such as Ru, Rh, Pb, Os, Ir or Pt is preferably used as the electrode material. Further, alloy materials such as paste and solder including the above-mentioned materials also have high conductivity and can be used preferably. Further, for example, conductive oxide materials such as IrO (iridium oxide), SRO (strontium ruthenate), ITO (conductive oxidized gas) and BPO (barium hydrochloride) are also preferable as the electrode material. Further, the electrode film may have a single layer construction or a multi-layer construction. For example, in order to enhance the closely-contacting ability with the substrate, a construction such as Pt/Ti can be used. A film thickness of the electrode film is preferably about 100 nm to 1000 nm and is, more preferably, smaller than 500 nm. If the film thickness of the electrode film is greater than 100 nm, the resistance of the electrode film becomes sufficiently small, and, whereas, if the thickness is smaller than 1000 nm, a possibility of obstructing the piezoelectric property of the electrode film is eliminated and this is preferable.

Further, when the first electrode film includes an oxide electrode film having a perovskite structure, a uniaxial orientation film or a single crystal film can easily be manufactured. Particularly, since SRO has lattice constant of about 4 Å which is near lattice constant of the lead magnesiumate niobate titanate having the perovskite structure, the uniaxial orientation film or the single crystal film can easily be manufactured.

Although a method for forming the electrode film according to the illustrated embodiment is not particularly limited, the electrode film having a thickness smaller than 1000 nm can normally be formed by a thin film forming method such as a sol-gel method, a hydrothermal synthesizing method, a gas deposition method or an electrophoresis method, or by a thin film forming method such as a sputtering method, a CVD method, an MOCVD method, an ion beam deposition method, a molecular beam epitaxy method, a laser ablation method and the like. In such a thin film forming method, since it is possible to attain the uniaxial orientation and/or single crystal of the electrode film by using epitaxial growth from the substrate or the buffer layer, the uniaxial orientation and/or single crystal of the piezoelectric element can easily be obtained.

<Liquid Discharge Head>

Next, a liquid discharge head according to the illustrated embodiment will be explained.

A liquid discharge head according to the illustrated embodiment comprises discharge ports, separate liquid chambers in communication with the respective discharge ports, vibrating plates each constituting a part of the corresponding separate liquid chamber, and piezoelectric elements disposed out of the respective separate liquid chambers to apply vibrations to the respective vibrating plates. The liquid discharge head is adapted to discharge liquid from the separate liquid chamber through the discharge port by volume change in the separate liquid chamber caused by the vibrating plate and is characterized in that each of the piezoelectric elements is a piezoelectric element of the present invention.

By using the piezoelectric element of the present invention as the piezoelectric element, a liquid discharge head having a uniform and high discharging performance and capable of performing minute patterning can easily be obtained. The liquid discharge head according to the illustrated embodiment may be used in image forming apparatus such as an ink jet printer, a Fax, a composite machine, a copier and the like or in industrial discharge apparatuses for discharging liquid other than ink.

Figure 7:
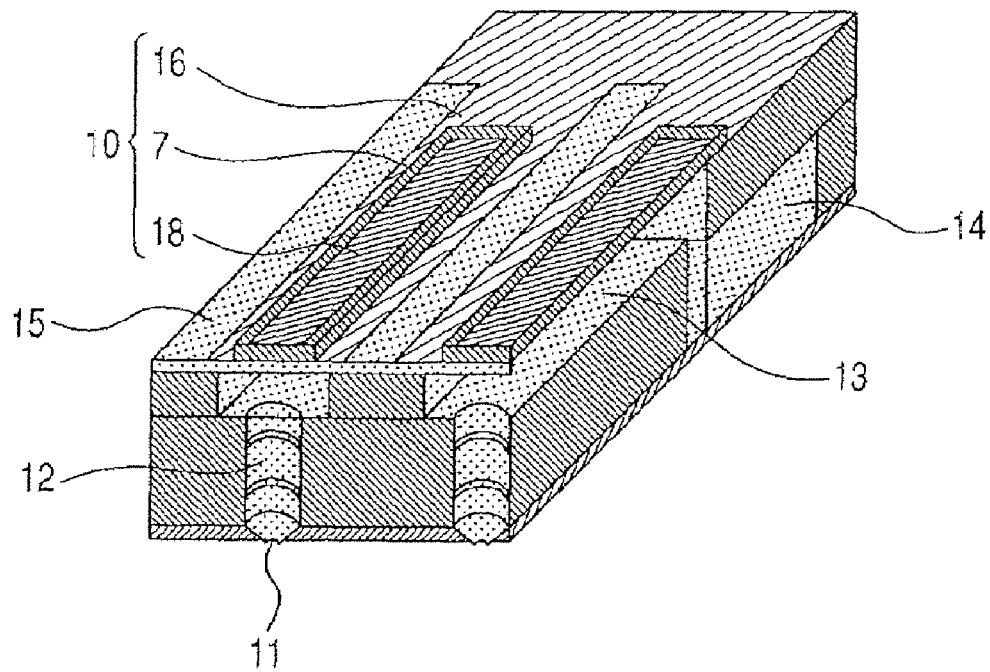
FIG. 7 is a schematic view showing a liquid discharge head according to an embodiment of the present invention.

Now, the liquid discharge head according to the illustrated embodiment will be explained with reference to FIG. 7. FIG. 7 is a schematic view showing an example of the liquid discharge head according to the illustrated embodiment. The liquid discharge head according to the embodiment shown in FIG. 7 comprises discharge ports 11, communication bores 12 for communicating the discharge ports 11 with corresponding separate liquid chambers 13, and a common liquid chamber 14 for supplying liquid to the separate liquid chambers 13, so that the liquid is supplied to the discharge ports 11 along these communication paths. A part of the separate liquid chamber 13 is constituted by a vibrating plate 15. A piezoelectric element 10 for applying vibration to the vibrating plate 15 is disposed out of the separate liquid chamber 13. When the piezoelectric element 10 is driven, the vibrating plate 15 is vibrated by the piezoelectric element 10 to change a volume of the separate liquid chamber 13, thereby discharging the liquid from the separate liquid chamber 13 through the discharge port. In the embodiment shown in FIG. 7, although the piezoelectric element 10 has a rectangular shape, such a shape may be an ellipse, a circle or a parallelogram.

Figure 8:
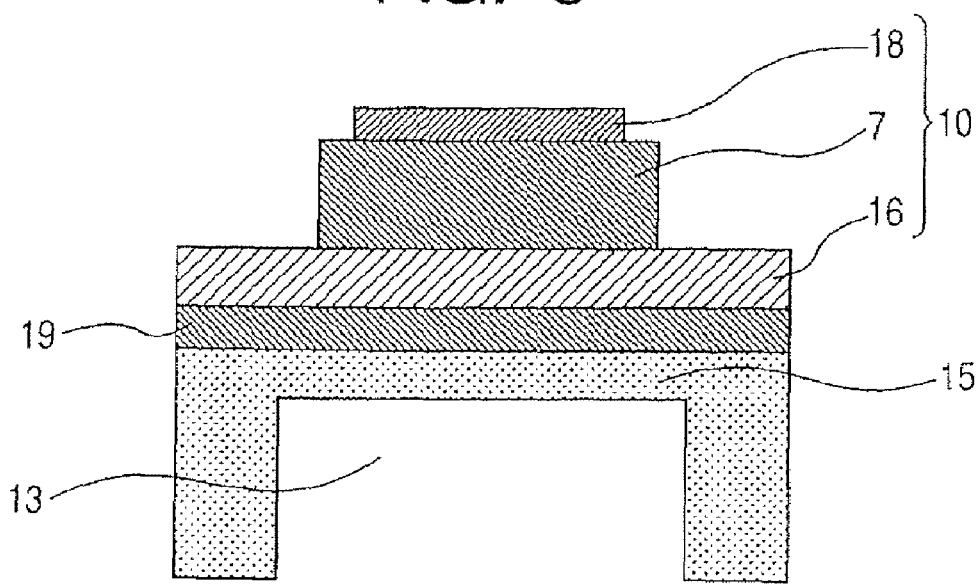
FIG. 8 is a schematic width-wise sectional view of the liquid discharge head of FIG. 7.

A schematic cross-section of the liquid discharge head shown in FIG. 7 in a width-wise direction is shown in FIG. 8. Now, with reference to FIG. 8, the piezoelectric element 10 constituting a part of the liquid discharge head according to the illustrated embodiment will be described in more detail. Although a cross-sectional shape of the piezoelectric element 10 is shown as a rectangular shape, a trapezoidal shape or an inverted trapezoidal shape may be used. Further, in FIG. 8, although the first electrode film 6 corresponds to a lower electrode film 16 and the second electrode film 8 corresponds to an upper electrode film 18, the first electrode film 6 and the second electrode film 8 constituting parts of the piezoelectric element 10 according to the illustrated embodiment may be either the lower electrode film 16 or the upper electrode film 18. The reason is that the lower and upper electrode films are defined by a manufacturing method for a device and, in any case, they can achieve the effects of the present invention. Further, the vibrating plate 15 may be formed from the substrate 5 constituting a part of the piezoelectric element 10 according to the illustrated embodiment. Further, a buffer layer 19 may be provided between the vibrating plate 15 and the lower electrode film 16.

Figure 9:
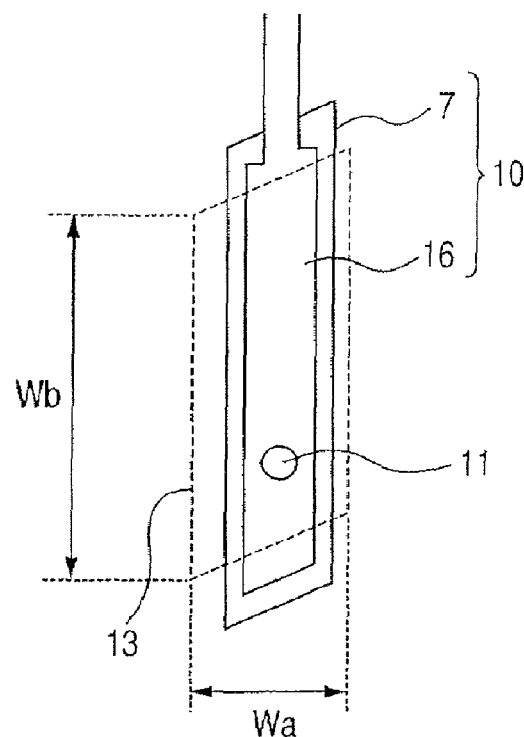
FIG. 9 is a schematic view of the liquid discharge head of FIG. 7, looked at from an upper side (discharge port side).
Figure 10:
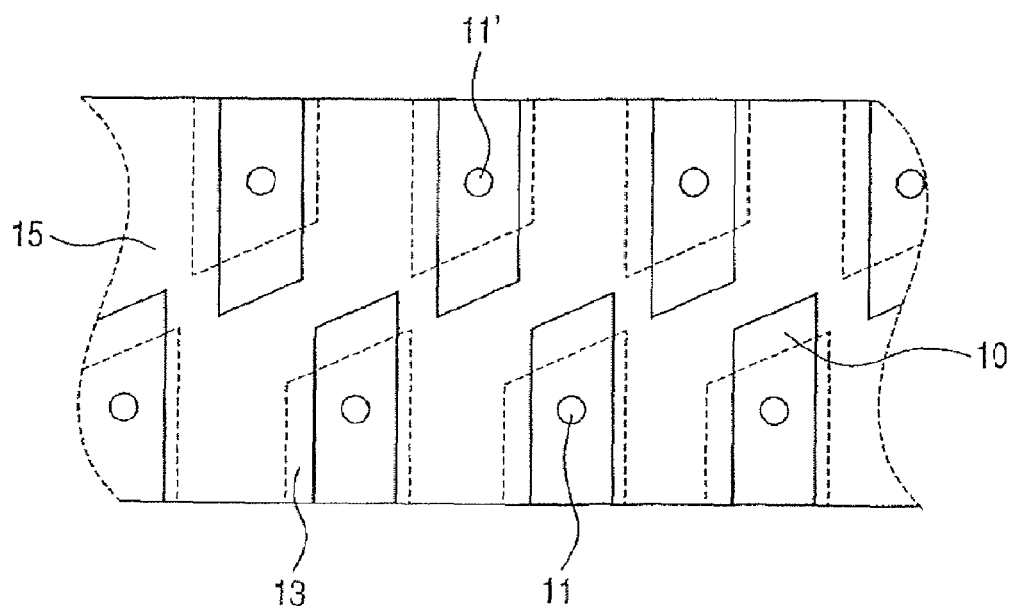
FIG. 10 is a schematic view of the liquid discharge head of FIG. 7, looked at from an upper side (discharge port side).

FIGS. 9 and 10 are schematic views of the liquid discharge head shown in FIG. 7, looked at from an upper side (side of the discharge port 11). Areas 13 shown by the broken lines are the separate liquid chambers 13 to which pressures are applied. The piezoelectric element 10 is appropriately patterned and formed above the separate liquid chamber 13. For example, in FIG. 9, the lower electrode film 16 is extended to an area where the piezoelectric substance 7 does not exist, and the upper electrode film 18 (not shown in FIG. 9) are extended to an area opposite to the lower electrode film 16 and is connected to a drive source. In FIGS. 9 and 10, although the lower electrode film 16 is shown in a patterned condition, as shown in FIG. 8, the lower electrode film may be disposed in an area where the piezoelectric substance 7 does not exist. The piezoelectric substance 7, lower electrode film 16 and upper electrode film 18 can be patterned in an optimum manner for achieving their aims so long as shortage and/or breakage do not exist between a drive circuit and the piezoelectric element 10 during the driving operation. Further, the reason why the shape of the separate liquid chamber 13 is shown as parallelogram is that, when a Si(110) substrate is used as the substrate and the separate liquid chamber is manufactured by wet etching with alkali, the parallelogram is obtained. Other than the parallelogram, the shape of the separate liquid chamber 13 may be a rectangle or a square. In general, although a plurality of separate liquid chambers 13 are formed with a predetermined pitch therebetween on the vibration plates 15, as shown in FIG. 10, the separate liquid chambers may be arranged in a staggered fashion, or a single separate liquid chamber may be used for a particular object.

A thickness of the vibrating plate 15 is normally 0.5 to 10 μm and preferably 1.0 to 6.0 μm. When the buffer layer 19 is provided, such a thickness includes a thickness of the buffer layer. Further, plural layers other than the buffer layer may be formed. For example, etching stop layers required when the vibrating plates and the separate liquid chambers are formed from the same substrate may be provided. A width Wa (refer to FIG. 9) of the separate liquid chamber 13 is normally 30 to 180 μm. Depending upon an amount of a liquid droplet to be discharged, a length Wb (refer to FIG. 9) is normally 0.3 to 6.0 μm. A shape of the discharge port 11 is normally a circle or a star-shape and it is preferable that a diameter of the discharge port is normally 7 to 30 μm. It is preferable that a cross-section of the discharge port 11 has a tapered portion flared toward the communication port 12. It is preferable that a length of the communication port 12 is normally 0.05 mm to 0.5 mm. If the length of the communication port is smaller than 0.5 mm, an adequate discharging speed of the liquid droplet can be obtained. Further, if the length is greater than 0.05 mm, dispersion in discharging speeds of the liquid droplets discharged from the respective discharge ports is reduced; this is preferable. Further, members for forming vibrating plates, separate liquid chambers, common liquid chamber and communication ports constituting the liquid discharge head according to the illustrated embodiment may be formed form the same material or different materials. For example, if Si (silicon) is used, such members can be manufactured with high accuracy by a lithography method and an etching method. Further, regarding members selected when the materials are different, materials of such members are preferably selected so that differences between coefficients of thermal expansion thereof are included within a range from $1\times10^{-8}/°$ C. to $1\times10^{-6}/°$ C. For example, for a silicon substrate, a SUS substrate or a Ni substrate can preferably be selected.

<Method for Manufacturing Liquid Discharge Head>

Next, a method for manufacturing the liquid discharge head according to the illustrated embodiment will be explained. The method for manufacturing the liquid discharge head according to the illustrated embodiment comprises at least the following steps of:

(1) forming a discharge port;
(2) forming a communication port communicating the discharge port with a separate liquid chamber;
(3) forming the separate liquid chamber;
(4) forming a common liquid chamber in communication with the separate liquid chamber;
(5) forming a vibrating plate for applying vibration to the separate liquid chamber; and
(6) manufacturing a piezoelectric element for applying vibration to the vibrating plate disposed out of the separate liquid chamber.

Concretely, for example, in a method for manufacturing the liquid discharge head according to the illustrated embodiment, by performing the above step (3), a part of the separate liquid chamber and the vibrating plate are formed on a substrate in which the piezoelectric element 10 was formed by performing the above step (6). Separately, by performing the above steps (2) and (4), a substrate in which the communication port and the common liquid chamber were formed is manufactured, and, by performing the above step (1), a substrate having the discharge port is formed, and then, by laminating and integrating these substrate, the liquid discharge head is manufactured. Further, in a second method for manufacturing the liquid discharge head, separately, at least, a substrate in which the separate liquid chamber is to be formed or a substrate in which the separate liquid chamber was formed is manufactured. Then, onto this substrate, the piezoelectric element or the vibrating plate and the piezoelectric element are transferred from a substrate in which the piezoelectric element was formed by performing the above step (6) or from a substrate in which the vibrating plate and the piezoelectric element were formed by performing the above steps (5) and (6). Then, a substrate portion, at least opposed to the piezoelectric element, of the substrate into which the piezoelectric element or the vibrating plate and the piezoelectric element were transferred is worked to form the separate liquid chamber by performing the above step (2). Further, similar to the first method, both a substrate in which the communication port and the common liquid chamber were formed and a substrate in which the discharge port was formed are manufactured, and, by laminating and integrating these substrates, the liquid discharge head is manufactured.

Figure 11:
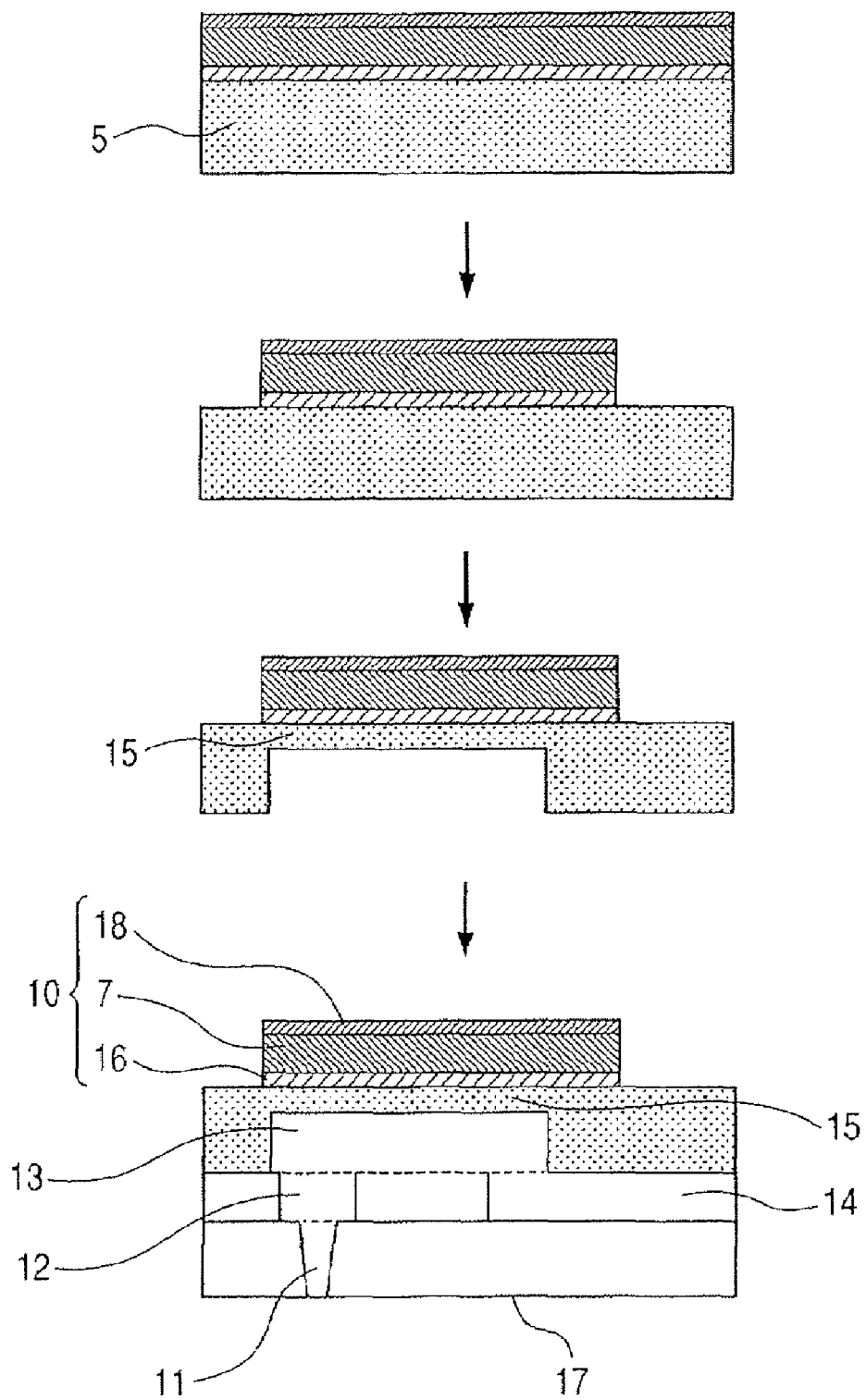
FIG. 11 is a schematic view showing an example of steps of manufacturing the liquid discharge head according to the embodiment.

As the first method, the following manufacturing method can be proposed. That is to say, in this manufacturing method, as shown in FIG. 11, first of all, in a similar manner to the piezoelectric element manufacturing method, the piezoelectric element 10 is provided on the substrate 5. Then, at least in a condition that the piezoelectric element 10 was subjected to the patterning, a part of the substrate 5 is removed to form a part of the separate liquid chamber 13 and to form the vibrating plate 15. Separately, a substrate having the common liquid chamber 14 and the communication port 12 is manufactured, and further, a substrate in which the discharge port 11 was formed is manufactured. Lastly, by laminating and integrating these substrates, the liquid discharge head is manufactured. As a method for removing a part of the substrate 5, a wet etching method, a dry etching method or a sand mill method can be used. By removing a part of the substrate 5 by means of such a method, at least the vibrating plate 15 and at least a part of the separate liquid chamber 13 can be formed.

Figure 12:
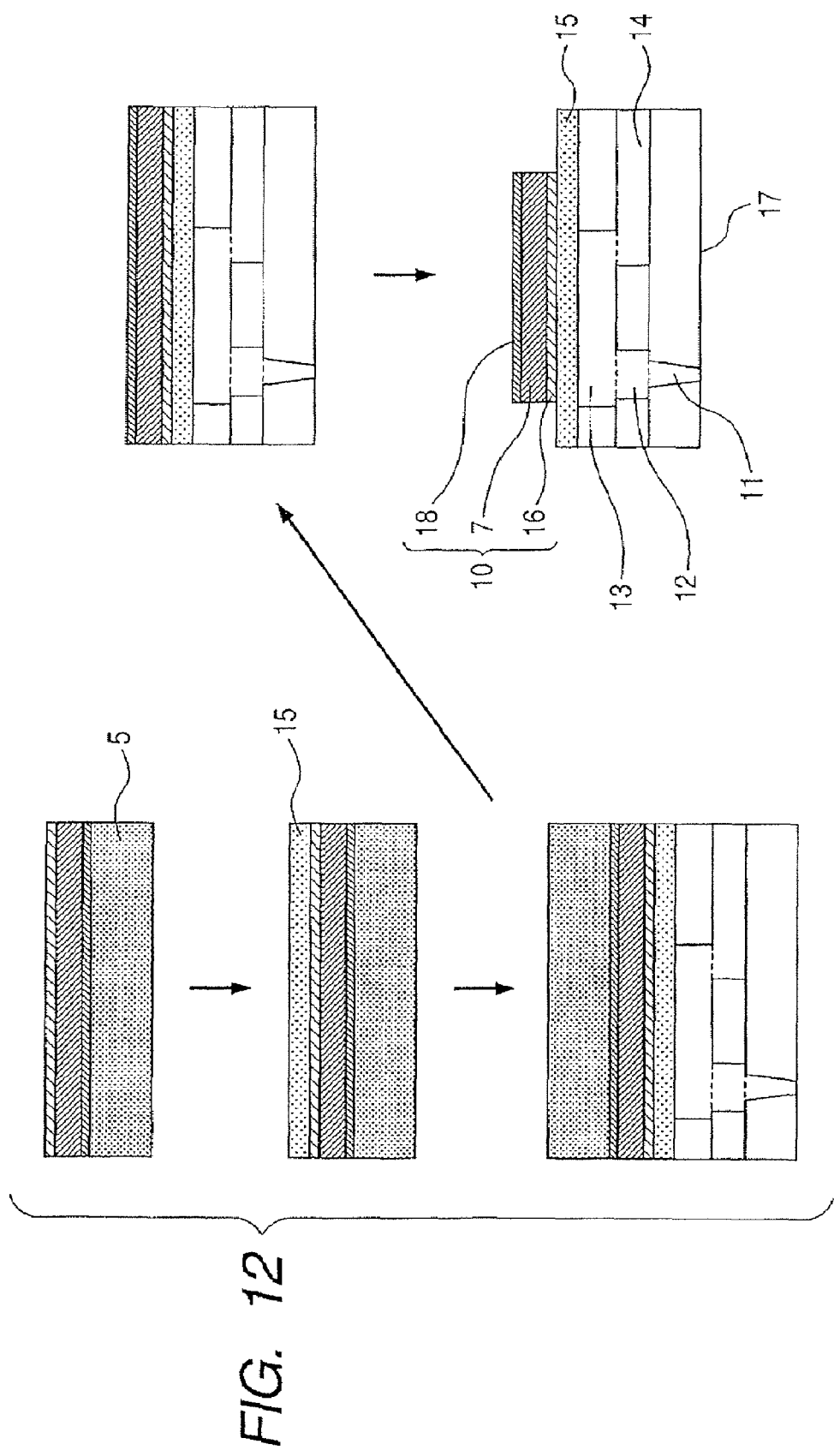
FIG. 12 is a schematic view showing an example of steps of manufacturing the liquid discharge head according to the embodiment.

As the second method, the following manufacturing method can be proposed. That is to say, in this manufacturing method, for example, as shown in FIG. 12, first of all, in a similar manner to the piezoelectric element manufacturing method, the piezoelectric element 10 is provided on the substrate 5. Then, in a condition that the piezoelectric element 10 is not subjected to the patterning, a substrate in which the vibrating plate 15 was film-formed on the piezoelectric element is manufactured. Further, a substrate in which the separate liquid chamber 13 was formed, a substrate in which the communication port 12 and the common liquid chamber 14 were formed and a substrate in which the discharge port 11 was formed are manufactured, and then, after these substrate are laminated, the vibrating plate and the piezoelectric element are transferred from the substrate.

Figure 13:
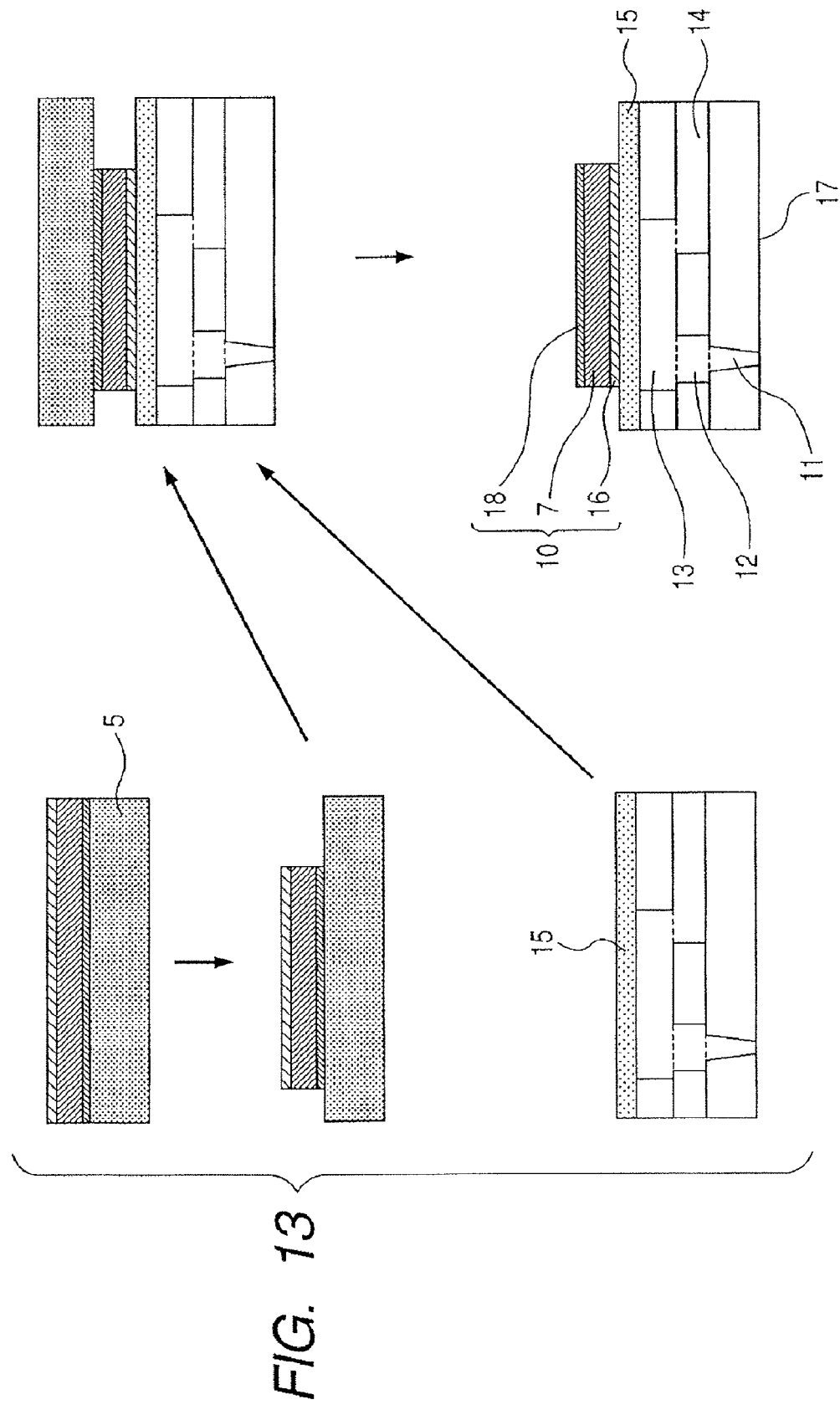
FIG. 13 is a schematic view showing an example of steps of manufacturing the liquid discharge head according to the embodiment.

Further, the following manufacturing method can be proposed. That is to say, in this manufacturing method, as shown in FIG. 13, first of all, the piezoelectric element 10 is formed on the substrate 5 and is subjected to the patterning, thereby forming the piezoelectric element. Separately, a substrate in which the vibrating plate 15 and a part of the separate liquid chamber 13 were provided, a substrate in which the common liquid chamber 14 and the communication port 12 were provided and a substrate in which the discharge port 11 was formed are manufactured. Further, these substrates are laminated to obtain an assembly and the piezoelectric element 10 is transferred from the substrate onto the assembly, thereby manufacturing the liquid discharge head.

Although an inorganic adhesive or an organic adhesive can be used to achieve the joining upon the transferring, metal joining using an inorganic material is more preferable. The material used for the metal joining may be In, Au, Cu, Ni, Pb, Ti, Cr or Pb. When such a material is used, since the joining can be achieved at a low temperature smaller than 300° C. and a difference in coefficient of thermal expansion between the material and the substrate becomes small, a problem regarding camber of the piezoelectric element when elongated can be avoided and damage to the piezoelectric element is reduced.

Figure 14A:
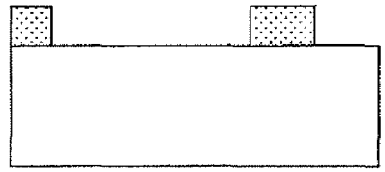
FIGS. 14A, 14B, 14C, 14D, 14E and 14F are schematic views showing an example of steps of manufacturing the liquid discharge head according to the embodiment.
Figure 14E:
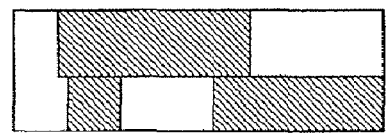
Figure 14B:
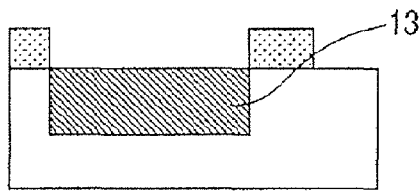
Figure 14F:
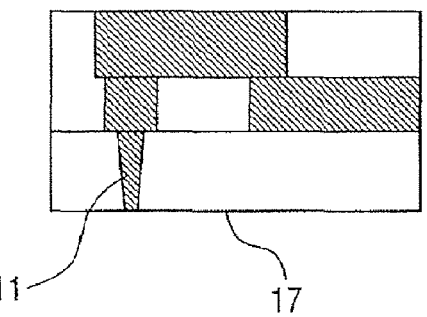
Figure 14C:
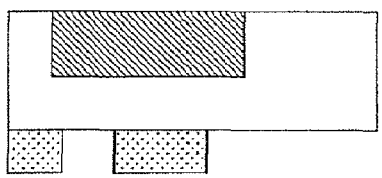
Figure 14D:
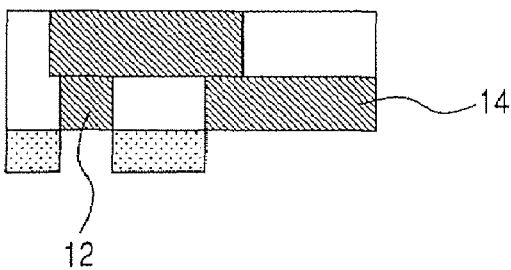
Figures 1, 15:
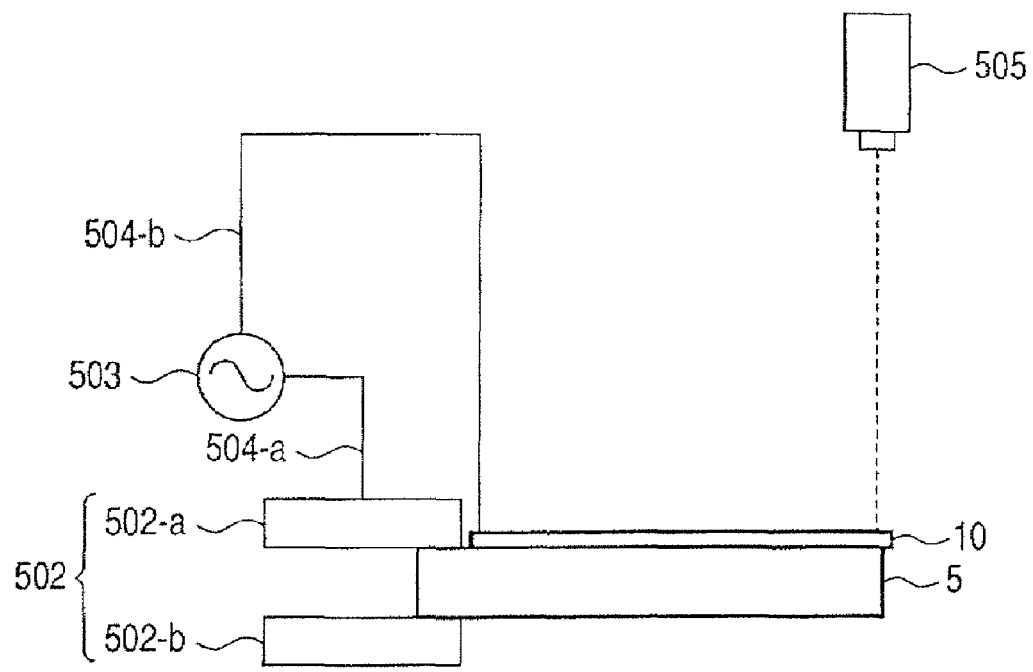
Figures 2, 15:
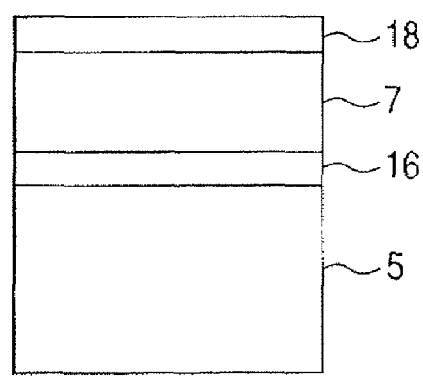
Figures 3, 15:
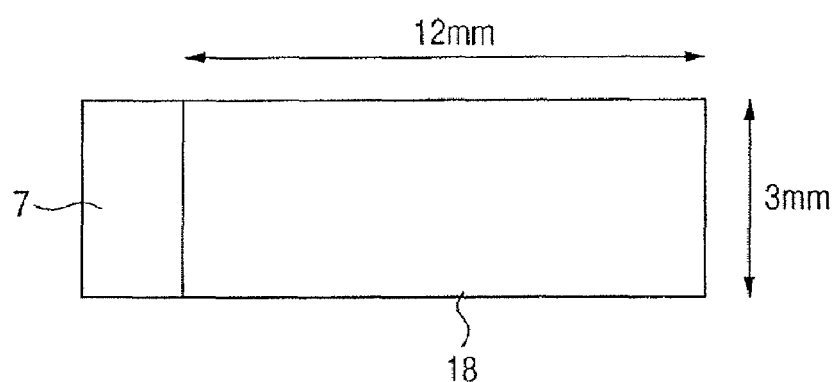

The communication port 12 and common liquid chamber 14 in the first method and the separate liquid chamber 13, communication port 12 and common liquid chamber 14 can be formed, for example, by performing the patterning of a forming member (substrate) by lithography and removing a part of the member by etching. For example, in the case of the second method, by performing steps shown in FIGS. 14A to 14E, the separate liquid chamber 13, communication port 12 and common liquid chamber 14 are formed. In FIGS. 14A to 14F, FIG. 14A shows a step for forming a mask for the separate liquid chamber 13 and FIG. 14B shows a step in which the separate liquid chamber 13 is worked from the above by etching or the like (a solid black portion means a worked area). Further, FIG. 14C shows a step for removing the mask used in the formation of the separate liquid chamber 13 and forming a mask for the communication port 12 and the common liquid chamber 14 and FIG. 14D shows a step in which the communication port 12 and the common liquid chamber 14 are worked from the below by etching. Further, FIG. 14E schematically shows a condition that the mask used in the formation of the communication port 12 and the common liquid chamber 14 was removed and the separate liquid chamber, communication port 12 and common liquid chamber 14 were formed. The discharge port 11 is formed by performing etching, machining or laser processing of a substrate 17. FIG. 14F shows a condition that, after FIG. 14E, the substrate 17 in which the discharge port 11 was formed is joined to the substrate in which the separate liquid chamber 13, communication port 12 and common liquid chamber 14 were formed. A surface of the substrate 17 in which the discharge port was formed is preferably subjected to a water-repelling treatment. A method for joining the substrates is similar to the joining method upon the transferring, but another joining method such as anode oxidation joining may be used.

In the second method, it is preferable that another substrate onto which the piezoelectric element 10 is transferred from the substrate 5 uses the assembly shown in FIG. 14E or FIG. 14F. Here, when the vibrating plate was formed on the piezoelectric element on the substrate 5, they are directly transferred onto the separate liquid chamber 13 in the condition FIG. 14E or FIG. 14F. On the other hand, when the vibrating plate was not formed on the piezoelectric element on the substrate 5, a vibrating plate is film-formed by filling resin into a hole of the separate liquid chamber 13 in the condition FIG. 14E or FIG. 14F, and thereafter, the resin is removed by etching to form the vibrating plate, and then, the plate is transferred. In this case, it is preferable that the vibrating plate is formed by a film forming method such as a sputtering method, a CVD method or the like. Further, the pattern forming step for the piezoelectric element 10 may be performed before or after the transferring.

<Evaluation of Piezoelectric Property>

The evaluation of the piezoelectric property of the piezoelectric element according to the illustrated embodiment was carried out by a $d_{31}$ measuring method using a cantilever of unimorph type. A measuring method and a schematic construction are shown in FIGS. 15-1, 15-2 and 15-3.

The piezoelectric element 10 obtained by forming the lower electrode film 16, piezoelectric substance 7 and upper electrode film 18 on the substrate in order has a construction of a cantilever of unimorph type fixed at its one side by a clamping tool 502. An upper portion 502-a of the clamping tool 502 is formed from a conductive material and is electrically contacted with the lower electrode film 16 of the piezoelectric substance 7 and is connected to one of the output terminals (not shown) of an AC power source 503 via an electric cable 504-a. The other output terminal (not shown) of the AC power source 503 is connected to the upper electrode film 18 via an electric cable 504-b to supply AC voltage to the piezoelectric substance 7.

The piezoelectric substance 10 is expanded and contracted by an electric field supplied by the AC power source 503. As a result, the substrate 5 is subjected to strain, with the result that the cantilever of unimorph type is vibrated upwardly and downwardly around the end thereof fixed by the clamping tool 502. In this case, vibration of the unclamped end of the piezoelectric element 10 is monitored by a laser Doppler velocity meter (LDV) 505, thereby measuring a displacement amount of the cantilever of unimorph type regarding the inputted electrical field.

In this case, the displacement amount of the cantilever of unimorph type regarding input voltage V is appropriately expressed by the following equation 1 (refer to J. G. Smith, W. Choi, "The constituent equations of piezoelectric heterogeneous bimorph", IEEE trans. Ultrason. Ferro. Freq. Control", 1991, volume 38, p. 256-270).

In the equation 1, although property value terms of the lower electrode film, upper electrode film and other buffer layer are not included, if a thickness h of the substrate is sufficiently thin in comparison with thicknesses of these layers, since property values and film thicknesses of these layers can be neglected, the equation 1 becomes a substantially sufficient approximate equation.

Equation 1

$$\delta = -3d_{31}S_{11}{}^S S_{11}{}^P h^S (h^S + h^P) L^2 V/K \qquad \text{Equation 1-1}$$

$$K = (S_{11}{}^S)^2 (h^P)^4 + 4S_{11}{}^S S_{11}{}^P h^S (h^P)^3 + 6S_{11}{}^S S_{11}{}^P (h^S)^2 (h^P)^2 + 4S_{11}{}^S S_{11}{}^P (h^S)^3 h^P + (S_{11}{}^P)^2 (h^S)^4 \qquad \text{Equation 1-2}$$

δ: displacement amount of tip end of cantilever
V: input voltage
L: length of cantilever
$S_{11}{}^S$: substrate compliance (11 constituents)
$S_{11}{}^P$: piezoelectric substance compliance (11 constituents)
$h^S$: substrate thickness
$h^P$: piezoelectric substance thickness By measuring the displacement amount of the cantilever of unimorph type regarding the input electric field from this equation, $d_{31}$ of the piezoelectric element can be determined.

<Liquid Discharge Apparatus>

Next, a liquid discharge apparatus using the above-mentioned liquid discharge head will be explained.

Figure 18:
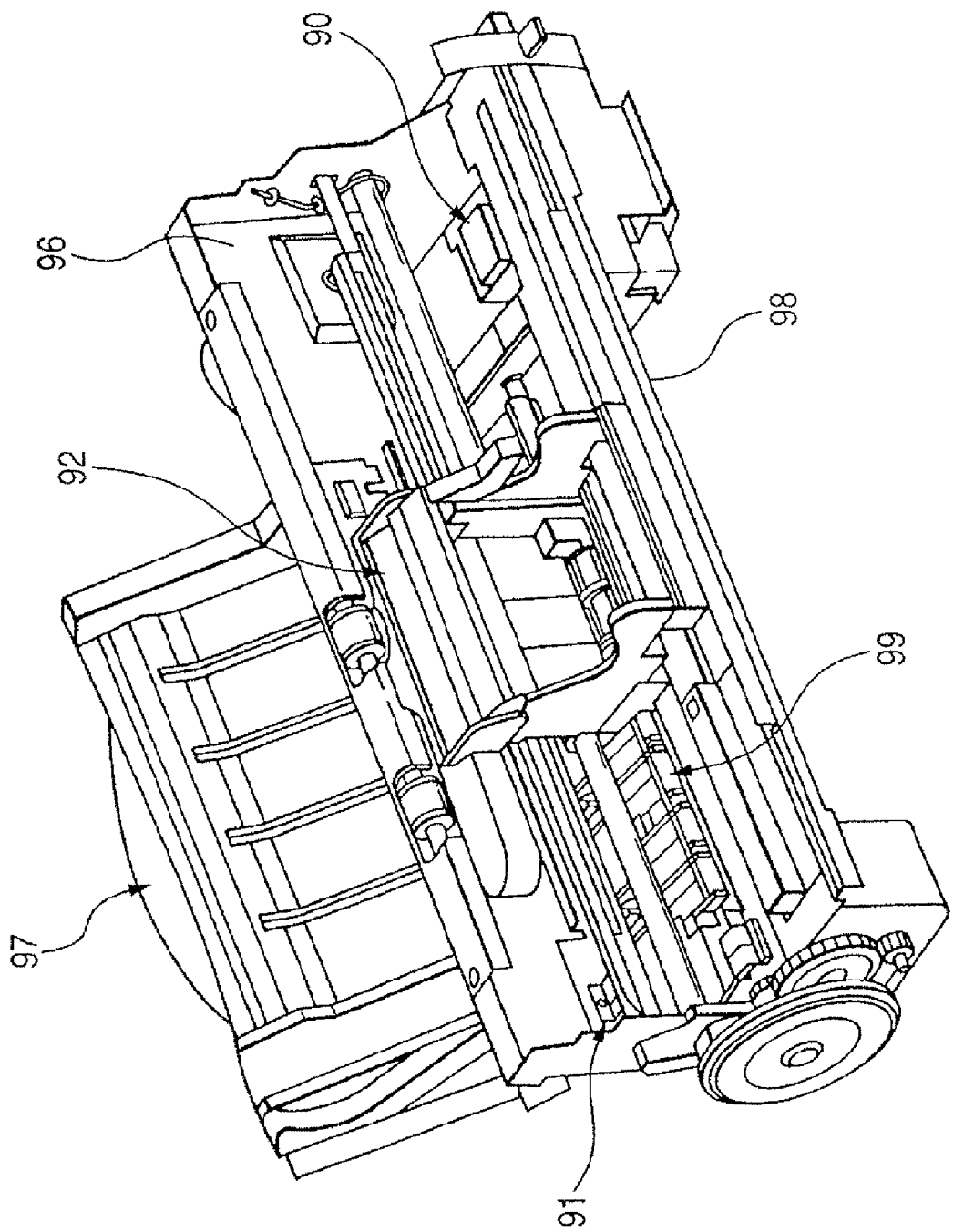
FIG. 18 is a schematic view of a liquid discharge apparatus according to an embodiment of the present invention.

As an example of a liquid discharge apparatus according to this embodiment, a liquid discharge apparatus 81 is shown in FIG. 18 in a condition that an outer housing is removed. As shown in FIG. 18, an ink jet recording apparatus as the liquid discharge apparatus includes an automatic feeding portion 97 for automatically feeding a recording paper as a recording medium into an apparatus body 96. Further, the apparatus comprises a conveying portion 99 for directing the recording paper supplied from the automatic feeding portion 97 to a predetermined recording position and for directing the recording paper from the recording position to a discharge portion 98, a recording portion 91 for performing the recording on the recording paper conveyed to the recording position, and a recovery portion 90 for performing a recovery treatment of the recording portion 91. The liquid discharge head according to the illustrated embodiment is housed in the recording portion 91 and the recording portion is provided with a carriage 92 which can reciprocally shift on a rail.

In such an ink jet recording apparatus, the carriage 92 is shifted on the rail by an electric signal sent from a computer, and, when drive voltage is applied to the electrodes pinching the piezoelectric substance therebetween, the piezoelectric substance is displaced. By the displacement of the piezoelectric substance, the corresponding separate liquid chamber is pressurized via the vibrating plate 15 to discharge ink from the discharge port 11, thereby performing the printing.

In the liquid discharge apparatus according to the illustrated embodiment, the liquid can be discharged uniformly at a high speed, and the apparatus can be smaller.

In the above-mentioned example, although the printer is shown, the liquid discharge apparatus according to the illustrated embodiment can be used as an ink jet recording apparatus such as a facsimile, a composite machine, a copier or the like, as well as one of industrial liquid discharge apparatuses.

EMBODIMENTS

Now, the piezoelectric element according to the illustrated embodiment, the liquid discharge head using such a piezoelectric element, and the manufacturing method thereof will be explained with reference to embodiments.

Embodiment 1

A procedure for manufacturing a piezoelectric element of an embodiment 1 is as follows:

A substrate having a lower electrode film was obtained by film-forming an $SrRuO_3$(SRO) film of 200 nm on an $SiTiO_3${100} substrate at a substrate temperature of 600° C. by a sputtering method.

Then, lead magnesiumate niobate titanate of a piezoelectric substance was film-formed on the substrate by using a pulse MOCVD method for supplying a raw material intermittently. The film-forming method will be fully explained later. As starting raw materials, the following materials were used:
(a) bis(hexa-methyl-acetyl-acetonate)lead $(Pb(thd)_2)$
(b) bis[6-ethyl-2,2-dimethyl-3,5-decane-dionate]magnesium (Mg $[6-C2H5-2,2-(CH3)2-C_{10}H_{15}O_2]_2$)
(c) propyl-tetra-ethyl-niobium $(NbC_3H_7(C_2H_5)_4)$
(d) tetra-isopropoxy-titanium (Ti $(C_3H_7O_4)_4$).

First of all, the starting raw materials were heated, and mixed gases of the starting raw materials and nitrogen gas used as inert carrier gas were produced. Mole ratios of the respective raw material gases in a supply path for mixed gas of inert carrier gas/starting raw material were adjusted so that an element ratio {Mg/(Mg+Nb)} of Mg, Nb and Ti of the raw material gas became 0.33 and an element ratio {Ti/(Mg+Nb+Ti)} became 0.42. Regarding oxygen raw material, such a material was excessively supplied to the film composition after the film formation.

Figure 16:
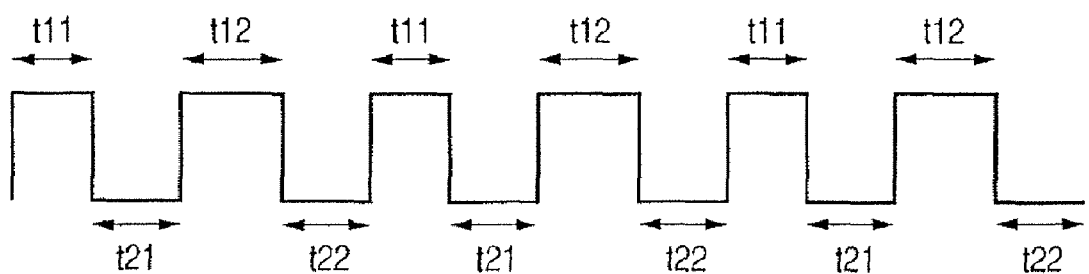
FIG. 16 is a schematic view showing a sequence of raw material supplying times for a pulse MOCVD method according to an embodiment of the present invention.

In the pulse MOCVD method, by alternately setting a time t1 for performing the film formation by blowing, from a nozzle onto a substrate for the film formation, gas obtained by mixing inert carrier gas/starting raw material mixed gas with oxygen gas, and, a time t2 for stopping the supplying of the inert carrier gas/starting raw material mixed gas, synthesis/film formation is carried out. In the illustrated embodiment, regarding the time t1 for performing the film formation by blowing, from the nozzle onto the substrate for the film formation, the gas obtained by mixing the inert carrier gas/starting raw material mixed gas with the oxygen gas and the time t2, two references t11, t12 and t21, t22 are set, respectively. In the illustrated embodiment, a time sequence shown in FIG. 16 was adopted and the synthesis/film formation was carried out. The respective times were selected to be t11=10 [sec], t12=25 [sec], t21=15 [sec] and t22=20 [sec].

In the times t11 and t12 during which the raw material is being supplied, pressure in the reaction chamber was set to 1130 [Pa] and, in this case, partial pressure of oxygen was set to 800 [Pa], and, a film having a thickness of 2.2 μm was formed by adjusting the film forming time while maintaining a temperature of the substrate to 650° C.

Figure 17:
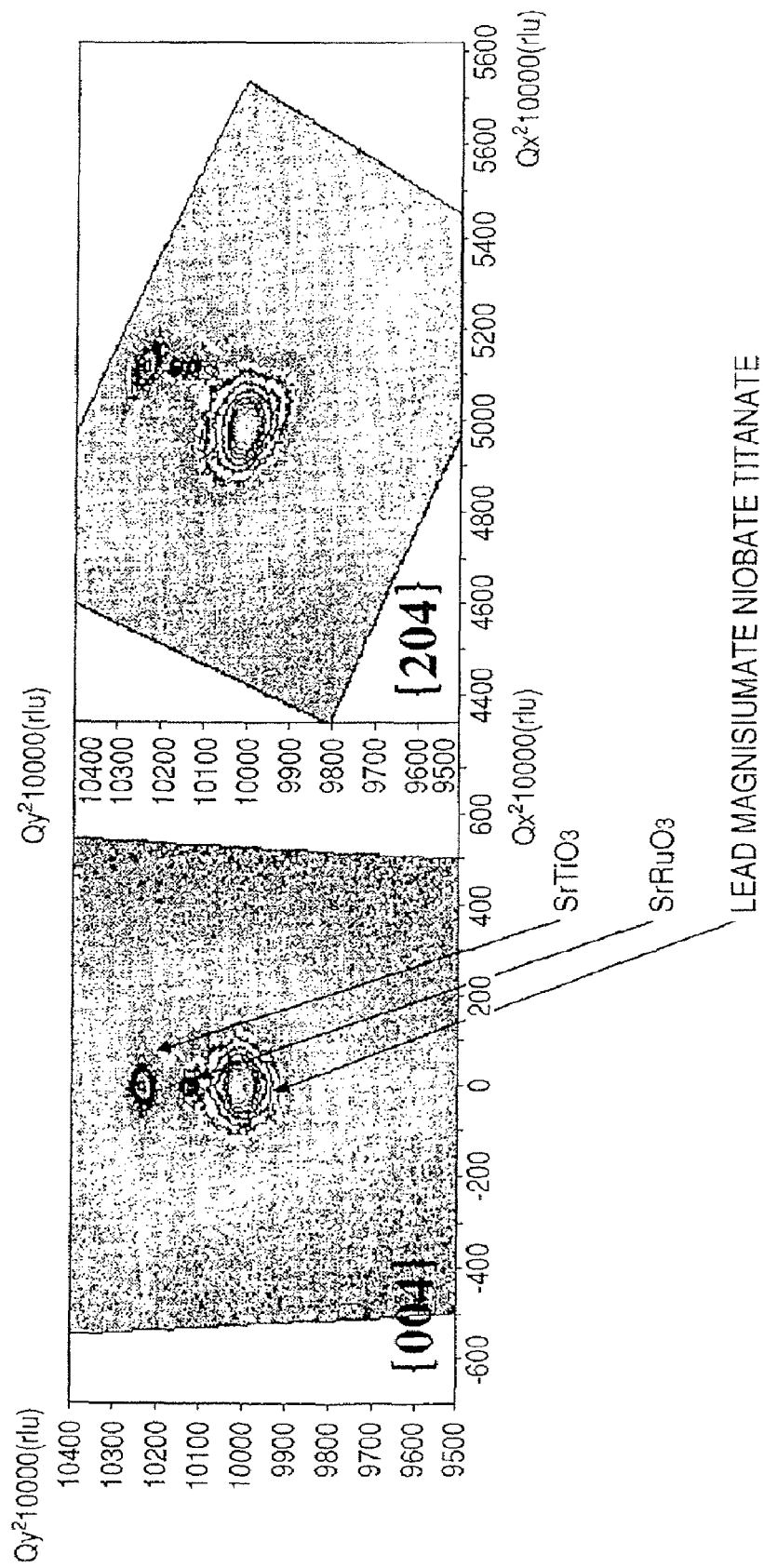
FIG. 17 is a view showing inverted lattice mapping of {004} and {204} according to X-ray diffraction of a piezoelectric substance of a first embodiment.

The element ratios of the lead magnesiumate niobate titanate of the piezoelectric substance were measured by an induction coupling plasma light emission analyzing apparatus. As a result of composition analysis (ICP composition analysis), when it was assumed that the sum of element ratios of Mg, Nb and Ti of the piezoelectric substance is 1, {Mg/(Mg+Nb)} was 0.33 and {Ti/(Mg+Nb+Ti)} was 0.42. Further, as a result of 2θ/θ measurement of X-ray diffraction, only reflection peaks caused by {00L} (L=1,2,3, . . . , n: n is integral number) face of the perovskite structure of the lead magnesiumate niobate titanate were detected. When positive polar points of the asymmetrical face {202} were measured, the reflection peaks appeared symmetrically by four times. As a result, it was ascertained that the piezoelectric substance was a single crystal film having <100> orientation perovskite structure of the lead magnesiumate niobate titanate. Similarly, by the inverted lattice mapping (FIG. 17) of {004} and {204} in the X-ray diffraction at a temperature of 300K, it was ascertained that the lead magnesiumate niobate titanate of the piezoelectric substance included both square crystal and rhombic crystal. Further, regarding the lattice volume, the rhombic crystal was 64.29 ($Å^3$) and the square crystal was 63.93 ($Å^3$), and, the lattice volume averaged by the volume partition rate was 64.17 ($Å^3$). As a result, it was ascertained that this lattice volume was smaller than a volume of a unit lattice of the bulk-like single crystal member of the lead magnesiumate noibate titanate having {Ti/(Mg+Nb+Ti)} of 0.42 at the temperature of 300K. Further, as the electrode films, a Ti film having a thickness of 4 nm and a Pt film having a thickness of 150 nm were formed on the piezoelectric substance in order by the sputtering method, thereby manufacturing the piezoelectric element of the embodiment 1.

Embodiment 2

A procedure for manufacturing a piezoelectric element of an embodiment 2 is as follows.

A substrate having a lower electrode film was obtained by film-forming an $SrRuO_3$(SRO) film of 200 nm on an $SiTiO_3${100} substrate at a substrate temperature of 600° C. by a sputtering method.

Then, lead magnesiumate niobate titanate of a piezoelectric substance was film-formed on the substrate to have a film thickness of 2.2 μm by using a pulse MOCVD method similar to the embodiment 1. Mole ratios of the respective raw material gases in a supply path for mixed gas of inert carrier gas/starting raw material were adjusted so that an element ratio {Mg/(Mg+Nb)} of Mg, Nb and Ti of the raw material gas became 0.33 and an element ratio {Ti/(Mg+Nb+Ti)} became 0.27. Regarding oxygen raw material, such a material was excessively supplied to the film composition after the film formation.

The element ratios of the lead magnesiumate niobate titanate of the piezoelectric substance were measured in a similar manner as that in embodiment 1. As a result of composition analysis (ICP composition analysis), when it was assumed that the sum of element ratios of Mg, Nb and Ti of the piezoelectric substance is 1, {Mg/(Mg+Nb)} was 0.33 and {Ti/(Mg+Nb+Ti)} was 0.26. Further, as a result of 2θ/θ measurement of X-ray diffraction, only reflection peaks caused by {00L} (L=1,2,3, . . . , n: n is integral number) face of the perovskite structure of the lead magnesiumate niobate titanate were detected. When positive polar points of the asymmetrical face {202} were measured, the reflection peaks appeared symmetrically by four times. As a result, it was ascertained that the piezoelectric substance was a single crystal film having <100> orientation perovskite structure of the lead magnesiumate niobate titanate. Similarly, by the inverted lattice mapping of {004} and {204} in the X-ray diffraction at a temperature of 300K, it was ascertained that the lead magnesiumate niobate titanate of the piezoelectric substance included rhombic crystal. Further, a lattice volume was 64.74 ($Å^3$) and, as a result, it was ascertained that this lattice volume was smaller than a volume of a unit lattice of the bulk-like single crystal member of the lead magnesiumate noibate titanate having {Ti/(Mg+Nb+Ti)} of 0.26 at the temperature of 300K. Further, as the electrode films, a Ti film having a thickness of 4 nm and a Pt film having a thickness of 150 nm were formed on the piezoelectric substance in order by the sputtering method, thereby manufacturing the piezoelectric element of the embodiment 2.

Embodiment 3

A procedure for manufacturing a piezoelectric element of an embodiment 3 is as follows.

After a $TiO_2$ film having a thickness of 4 nm was film-formed on an Si{100} substrate on which an $SiO_2$ layer, having a thickness of 100 nm, of a heat oxidation film was formed, a Pt film having a thickness of 100 nm was film-formed by a sputtering method at a substrate temperature of 200° C. The Pt film was a <111> orientation film. Further, as a lower electrode film, a $LaNiO_3$ (LRO) film having a thickness of 100 nm was film-formed on the Pt film by the sputtering method at the substrate temperature of 300° C. Further, an $SrRuO_3$ (SRO) film having a thickness of 200 nm was film-formed on the LNO layer at the substrate temperature of 600° C., thereby obtaining a substrate including the lower electrode film and the like. Both the electrode film and the SRO film were <100> orientation uniaxial crystal films.

Then, lead magnesiumate niobate titanate of a piezoelectric substance was film-formed on the substrate to have a film thickness of 4.7 μm by using a pulse MOCVD method similar to the embodiment 1. Mole ratios of the respective raw material gases in a supply path for mixed gas of inert carrier gas/starting raw material were adjusted so that an element ratio {Mg/(Mg+Nb)} of Mg, Nb and Ti of the raw material gas became 0.33 and an element ratio {Ti/(Mg+Nb+Ti)} became 0.75. Regarding oxygen raw material, such a material was excessively supplied to the film composition after the film formation.

The element ratios of the lead magnesiumate niobate titanate of the piezoelectric substance were measured in the similar manner as that in embodiment 1. As a result of composition analysis (ICP composition analysis), when it was assumed that the sum of element ratios of Mg, Nb and Ti of the piezoelectric substance is 1, {Mg/(Mg+Nb)} was 0.33 and {Ti/(Mg+Nb+Ti)} was 0.75. Further, as a result of 2θ/θ measurement of X-ray diffraction, only reflection peaks caused by {00L} (L=1,2,3, . . . , n: n is integral number) face of the perovskite structure of the lead magnesiumate niobate titanate were detected. When positive polar points of the asymmetrical face {202} were measured, a ring-shaped peak appeared. As a result, it was ascertained that the piezoelectric substance was a uniaxial orientation film having <100> orientation perovskite structure of the lead magnesiumate niobate titanate. Similarly, by the inverted lattice mapping of {004} and {204} in the X-ray diffraction at a temperature of 300K, it was ascertained that the lead magnesiumate niobate titanate of the piezoelectric substance included square crystal. Further, a lattice volume was 63.56 ($Å^3$) and, as a result, it was ascertained that this lattice volume was smaller than a volume of a unit lattice of the bulk-like single crystal member of the lead magnesiumate niobate titanate having {Ti/(Mg+Nb+Ti)} of 0.75 at the temperature of 300K. Further, as the electrode films, a Ti film having a thickness of 4 nm and a Pt film having a thickness of 150 nm were formed on the piezoelectric substance in order by the sputtering method, thereby manufacturing the piezoelectric element of the embodiment 3.

Embodiment 4

A procedure for manufacturing a piezoelectric element of an embodiment 4 is as follows.

After a surface of an Si{100} substrate was subjected to fluorine acid treatment, a Y-doped $ZrO_2$ film having a thickness of 100 nm was film-formed by a sputtering method at a substrate temperature of 800° C., and then, a $CeO_2$ film having a thickness of 60 nm was film-formed at the substrate temperature of 600° C. Both films were <100> orientation single crystal films. Further, as a lower electrode film, a $LaNiO_3$ (LRO) film having a thickness of 100 nm was film-formed on the Pt film by the sputtering method at the substrate temperature of 300° C. Further, an $SrRuO_3$ (SRO) film having a thickness of 200 nm was film-formed on the LNO layer at the substrate temperature of 600° C., thereby obtaining a substrate including the lower electrode film and the like. Both the electrode film and the SRO film were <100> orientation single crystal films.

Then, a piezoelectric element of the embodiment 4 was manufactured in the similar manner to the embodiment 1, except that the above-mentioned substrate having the lower electrode film and the like was used.

The element ratios of the lead magnesiumate niobate titanate of the piezoelectric substance were measured in the similar manner as that in embodiment 1. As a result of composition analysis (ICP composition analysis), when it was assumed that the sum of element ratios of Mg, Nb and Ti of the piezoelectric substance is 1, {Mg/(Mg+Nb)} was 0.33 and {Ti/(Mg+Nb+Ti)} was 0.42. Further, as a result of 2θ/θ measurement of X-ray diffraction, only reflection peaks caused by {00L} (L=1,2,3, . . . , n: n is integral number) face of the perovskite structure of the lead magnesiumate niobate titanate were detected. When positive polar points of the asymmetrical face {202} were measured, the reflection peaks appeared symmetrically by four times. As a result, it was ascertained that the piezoelectric substance was a single crystal film having <100> orientation perovskite structure of the lead magnesiumate niobate titanate. Similarly, by the inverted lattice mapping of {004} and {204} in the X-ray diffraction at a temperature of 300K, it was ascertained that the lead magnesiumate niobate titanate of the piezoelectric substance included both square crystal and rhombic crystal. Further, regarding the lattice volume, the rhombic crystal was 64.29 ($\text{Å}^3$) and the square crystal was 63.93 ($\text{Å}^3$), and, the lattice volume averaged by the volume partition rate was 64.17 ($\text{Å}^3$). As a result, it was ascertained that this lattice volume was smaller than a volume of a unit lattice of the bulk-like single crystal member of the lead magnesiumate niobate titanate having {Ti/(Mg+Nb+Ti)} of 0.42 at the temperature of 300K. Further, as the electrode films, a Ti film having a thickness of 4 nm and a Pt film having a thickness of 150 nm were formed on the piezoelectric substance in order by the sputtering method, thereby manufacturing the piezoelectric element of the embodiment 4.

Embodiment 5

A procedure for manufacturing a piezoelectric element of an embodiment 5 is as follows.

Lead magnesiumate niobate titanate having a thickness of 3 μm was film-formed as a piezoelectric substance on an La-doped $SrTiO_3$ {100} substrate serving also as a lower electrode by an RF sputtering method as shown in FIG. 4 while maintaining a substrate temperature to 600° C. Regarding element ratios of the target, {Mg/(Mg+Nb)}Target was 0.33 and {Ti/(Mg+Nb+Ti)} Target was 0.46. In the sputtering, by adjusting the sputtering time while maintaining sputtering gas $Ar/O_2$=20/1, sputtering electric power=8.6 $W/cm^2$, sputtering gas pressure=0.5 Pa and substrate temperature=600° C., the film was formed to have a film thickness of 3.6 μm.

The element ratios of the lead magnesiumate niobate titanate of the piezoelectric substance were measured in the similar manner as that in embodiment 1. As a result of composition analysis (ICP composition analysis), when it was assumed that the sum of element ratios of Mg, Nb and Ti of the piezoelectric substance is 1, {Mg/(Mg+Nb)} was 0.33 and {Ti/(Mg+Nb+Ti)} was 0.46. Further, as a result of 2θ/θ measurement of X-ray diffraction, only reflection peaks caused by {00L} (L=1,2,3, . . . , n: n is integral number) face of the perovskite structure of the lead magnesiumate niobate titanate were detected. When positive polar points of the asymmetrical face {202} were measured, the reflection peaks appeared symmetrically by four times. As a result, it was ascertained that the piezoelectric substance was a single crystal film having <100> orientation perovskite structure of the lead magnesiumate niobate titanate. Similarly, by the inverted lattice mapping of {004} and {204} in the X-ray diffraction at a temperature of 300K, it was ascertained that the lead magnesiumate niobate titanate of the piezoelectric substance included both square crystal and rhombic crystal. Further, regarding the lattice volume, the rhombic crystal was 63.92 ($\text{Å}^3$) and the square crystal was 63.97 ($\text{Å}^3$), and, the lattice volume averaged by the volume partition rate was 63.93 ($\text{Å}^3$). As a result, it was ascertained that this lattice volume was smaller than a volume of a unit lattice of the bulk-like single crystal member of the lead magnesiumate niobate titanate having {Ti/(Mg+Nb+Ti)} of 0.46 at the temperature of 300K. Further, as the electrode films, a Ti film having a thickness of 4 nm and a Pt film having a thickness of 150 nm were formed on the piezoelectric substance in order by the sputtering method, thereby manufacturing the piezoelectric element of the embodiment 5.

COMPARATIVE EXAMPLE

A procedure for manufacturing a piezoelectric substance thin film element is as follows.

Lead magnesiumate niobate titanate having a thickness of 3.0 μm was film-formed as a piezoelectric substance on an La-doped $SrTiO_3$ {100} substrate serving also as a lower electrode by a conventional RF sputtering method while maintaining a substrate temperature to 600° C. Regarding element ratios of the target, {Mg/(Mg+Nb)}Target was 0.33 and {Ti/(Mg+Nb+Ti)}Target was 0.36. In the sputtering, sputtering gas $Ar/O_2$=20/1, sputtering electric power=8.5 $W/cm^2$, sputtering gas pressure=1.0 Pa.

Regarding the element ratios of the lead magnesiumate niobate titanate of a piezoelectric film, as a result of composition analysis (ICP composition analysis) by using an induction coupling plasma light emission analyzing apparatus, {Mg/(Mg+Nb)} was 0.33 and {Ti/(Mg+Nb+Ti)} was 0.35. Further, as a result of 2θ/θ measurement of X-ray diffraction, only reflection peaks caused by {00L} (L=1,2,3, . . . , n: n is integral number) face of the perovskite structure of the lead magnesiumate niobate titanate were detected and, when positive polar points of the asymmetrical face {202} were measured, the reflection peaks appeared symmetrically by four times. As a result, it was ascertained that the piezoelectric substance was a single crystal film having <100> orientation perovskite structure of the lead magnesiumate niobate titanate. Similarly, by the inverted lattice mapping of {004} and {204} in the X-ray diffraction at a temperature of 300K, it was ascertained that the lead magnesiumate niobate titanate included the square crystal. Further, the lattice volume was 65.32 ($\text{Å}^3$). As a result, it was ascertained that this lattice volume was smaller than a volume of a unit lattice of the bulk-like single crystal member of the lead magnesiumate niobate titanate having {Ti/(Mg+Nb+Ti)} of 0.35 at the temperature of 300K. Further, as the electrode films, a Ti film having a thickness of 4 nm and a Pt film having a thickness of 150 nm were formed on the piezoelectric substance in order by the sputtering method, thereby manufacturing the piezoelectric element of the comparison example.

The following Table 1 shows measured voltage constants of the piezoelectric elements according to the embodiments 1 to 5 and the comparative example. The voltage constants were measured by a $d_{31}$ measuring method using a cantilever of unimorph type. A sample for the $d_{31}$ measurement was manufactured by working the upper electrode 18 of the piezoelectric element to a rectangular pattern of 12 mm×12 mm and then by cutting the pattern to a shape shown in FIG. 15-3 by means of a dicer. In this case, regarding the piezoelectric elements on the $SrTiO_3$ {100} substrates of the embodiments 1 and 2, the upper electrode 18 was arranged so that respective sides of the rectangular pattern were situated in parallel with the <100> directions of the SrTiO₃ {100} substrate. Further, regarding the piezoelectric elements on the Si{100} substrates of the embodiments 3 and 4, the upper electrode was arranged so that respective sides of the rectangular pattern were situated in parallel with the <100> directions of the Si{100} substrate. Further, regarding the piezoelectric element on the La-doped SrTiO₃ {100} substrate of the embodiment 5, the upper electrode was arranged so that respective sides of the rectangular pattern were situated in parallel with the <100> directions of the SrTiO₃ {100} substrate.

Upon determining $d_{31}$ according to the illustrated embodiment, as an input signal voltage to the sample, a sine wave having a frequency of 500 Hz was applied so that the piezoelectric element 10 was subjected to an electric field of 0 to 150 [kV/cm] (application of voltage of 0 to 45 V to the piezoelectric substance having a thickness of 3 μm). By measuring a displacement amount δ of a tip end of the cantilever regarding the input signal voltage, $d_{31}$ was determined. Regarding polarity of voltage, a polarity in which the maximum displacement is attained at the same electric field was selected. The reason why the sine wave is adopted as the input signal voltage is that, since the mass of the cantilever is great, an inertia term of the vibrating movement is removed from the displacement δ of the tip end of the cantilever.

Regarding the material property values used in the equation, in the embodiments 1, 2 and 5, $S_{11}^S = 3.8 \times 10^{-12}$ [m²/N]

$S_{11}^P = 59.5 \times 10^{-12}$ [m²/N]

and, in the embodiments 3 and 4, $S_{11}^S = 7.7 \times 10^{-12}$ [m²/N]

$S_{11}^P = 59.5 \times 10^{-12}$ [m²/N].

TABLE 1

|  | E: 1 | E: 2 | E: 3 | E: 4 | E: 5 | Comparative example |
|---|---|---|---|---|---|---|
| Voltage constant (pC/N) | −621 | −557 | −476 | −630 | −652 | −290 |

E: = embodiment

As shown in the Table 1, the thin film piezoelectric elements of the embodiments 1 to 5 could realize higher voltage properties than that of the comparative example.

Embodiment 6

Liquid Discharge Head

Next, a liquid discharge head according to an embodiment 6 was manufactured in the following procedure.

As a substrate, an SOI substrate comprising an epitaxial Si layer having a thickness of 500 nm and a SiO₂ layer having a thickness of 500 nm was used. A piezoelectric element was manufactured in the similar manner to the embodiment 4 except that this substrate was used, and, after an actuator portion was patterned, a Si substrate of a handle layer was subjected to dry etching by means of an induction coupling plasma method (ICP method), thereby forming vibrating plates and separate liquid chambers. Then, another Si substrate in which a common liquid chamber and communication ports were formed was adhered to the former substrate. Further, by adhering a substrate in which discharge ports were formed to the Si substrate in which the common liquid chamber and the communication ports were formed, a liquid discharge head in which the vibrating plate comprises a SiO₂ layer, a Si film, a Y-doped ZrO₂ film and a CeO₂ film was manufactured. This liquid discharge head was driven by applying a drive signal to the head. As a result that a displacement amount of the liquid discharge head was evaluated on the basis of a laser Doppler displacement system by illuminating a laser beam of φ 20 μm onto a central portion of the separate liquid chamber of the liquid discharge head from an upper electrode side, it was found that the liquid discharge head of the embodiment 6 exhibits great displacement of 0.15 μm.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2005-241430, filed Aug. 23, 2005 which is hereby incorporated by reference herein in its entirety.

What is claimed is:

1. A piezoelectric substance of single crystal or uniaxial crystal type,
wherein three lattice lengths a, b and c of a unit lattice of said piezoelectric substance are smaller than three lattice lengths $a_0$, $b_0$ and $c_0$ of a unit lattice of a bulk state of single crystal having a same temperature and a same composition, respectively, and a volume of the unit lattice of said piezoelectric substance is smaller than a volume of the unit lattice of the bulk state of the single crystal having the same temperature and the same composition.

2. A piezoelectric substance according to claim 1,
wherein said piezoelectric substance comprises a single crystal or a uniaxial crystal of lead magnesiumate niobate titanate having perovskite structure,
wherein when element ratios of magnesium, niobium and titanium constituting the lead magnesiumate niobate titanate are X, Y and Z, respectively, the element ratios X, Y and Z satisfy conditions of X+Y+Z=1 and 0.2<Z<0.8, and
wherein a volume of a unit lattice of the lead magnesiumate niobate titanate at a temperature of 300° K. is greater than 63.5 (Å³), and the volume of the unit lattice of the lead magnesiumate niobate titanate at a temperature of 300° K. is smaller than a value $V_1$ (Å³) from the following equation (1) under a condition of 0.2<Z<0.33 and is smaller than a value $V_2$ (Å³) from the following equation (2) under a condition of 0.33≦Z<0.8:

$$V_1 = -5.39 \times 66.3 \quad (1)$$

$$V_2 = -1.85 \times 65.1 \quad (2).$$

3. A piezoelectric substance according to claim 2, wherein a condition of 0.33≦Z<0.5 is satisfied.

4. A piezoelectric substance according to claim 1, wherein said piezoelectric substance has a film thickness greater than 1 μm and smaller than 10 μm.

5. A piezoelectric substance element comprising:
a piezoelectric substance of single crystal or uniaxial crystal type in which three lattice lengths a, b and c of a unit lattice of said piezoelectric substance are smaller than three lattice lengths $a_0$, $b_0$ and $c_0$ of a unit lattice of a bulk state of a single crystal having a same temperature and a same composition, respectively, and a volume of the unit lattice of said piezoelectric substance is smaller than a volume of the unit lattice of the bulk state of the single crystal having the same temperature and the same composition; and a pair of electrodes in contact with said piezoelectric substance.

6. A liquid discharge head comprising a separate liquid chamber in communication with a discharge port, and a piezoelectric substance element provided in correspondence to with the separate liquid chamber and adapted to discharge a liquid in the separate liquid chamber through the discharge port, wherein the piezoelectric substance element comprises a piezoelectric substance of single crystal or uniaxial crystal type in which three lattice lengths a, b and c of a unit lattice of the piezoelectric substance are smaller than three lattice lengths $a_0$, $b_0$ and $c_0$ of a unit lattice of a bulk state of a single crystal having a same temperature and a same composition, respectively, and a volume of the unit lattice of the piezoelectric substance is smaller than a volume of the unit lattice of the bulk state of the single crystal having the same temperature and the same composition, and wherein a pair of electrodes are in contact with the piezoelectric substance.

7. A method for manufacturing a piezoelectric substance according to any one of claims 1 to 4, comprising the steps of:

heating a substrate, located out of an area onto which a target area is projected in a direction perpendicular to a sputtering surface of a target, to a temperature greater than 400° C. and less than 800° C.; and forming the piezoelectric substance on a surface of the substrate by a magnetron sputtering method.

8. A method for manufacturing a piezoelectric substance according to claim 7, wherein the target comprises a pair of targets spaced apart from, opposed to and in parallel with each other, and wherein, in said step for forming the piezoelectric substance on the surface of the substrate, electrons in plasma are concentrated by a magnetic field generated by magnetic field generating means provided in association with the pair of targets and having different polarities.

9. A liquid discharge apparatus comprising a liquid discharge head including a separate liquid chamber in communication with a discharge port and a piezoelectric substance element provided in correspondence with the separate liquid chamber and adapted to discharge a liquid in the separate liquid chamber through the discharge port, wherein the piezoelectric substance element comprises a piezoelectric substance of single crystal or uniaxial crystal type in which three lattice lengths a, b and c of a unit lattice of the piezoelectric substance are smaller than three lattice lengths $a_0$, $b_0$ and $c_0$ of a unit lattice of a bulk state of a single crystal having a same temperature and a same composition, respectively, and a volume of the unit lattice of the piezoelectric substance is smaller than a volume of the unit lattice of the bulk state of the single crystal having the same temperature and the same composition, and wherein a pair of electrodes are in contact with the piezoelectric substance.

\* \* \* \* \*